US012058348B2

(12) United States Patent
Kianfar et al.

(10) Patent No.: US 12,058,348 B2
(45) Date of Patent: Aug. 6, 2024

(54) PARALLELIZED RATE-DISTORTION OPTIMIZED QUANTIZATION USING DEEP LEARNING

(71) Applicant: QUALCOMM Incorporated, San Diego, CA (US)

(72) Inventors: Dana Kianfar, Diemen (NL); Auke Joris Wiggers, Amsterdam (NL); Amir Said, San Diego, CA (US); Taco Sebastiaan Cohen, Amsterdam (NL); Reza Pourreza Shahri, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 967 days.

(21) Appl. No.: 17/070,589

(22) Filed: Oct. 14, 2020

(65) Prior Publication Data

US 2021/0329267 A1    Oct. 21, 2021

Related U.S. Application Data

(60) Provisional application No. 63/034,618, filed on Jun. 4, 2020, provisional application No. 63/011,685, filed on Apr. 17, 2020.

(51) Int. Cl.
*H04N 19/124* (2014.01)
*G05B 13/00* (2006.01)
(Continued)

(52) U.S. Cl.
CPC .......... *H04N 19/176* (2014.11); *G05B 13/00* (2013.01); *G06F 30/27* (2020.01); *G06N 3/02* (2013.01);
(Continued)

(58) Field of Classification Search
None
See application file for complete search history.

(56) References Cited

U.S. PATENT DOCUMENTS 8,553,769 B2 * 10/2013 He ................ H04N 19/33
375/240.19
8,767,822 B2    7/2014 Zuo et al.
(Continued)

FOREIGN PATENT DOCUMENTS

CN       112819699 A  *  5/2021  ........... G06T 3/4053
WO    WO-2021001030 A1 *  1/2021  ............. G06T 9/002

OTHER PUBLICATIONS

Progressive Image Transmission Using Self-supervised Backpropagation Neural Network ; Author: Gong et al. (Year: 1991).*
(Continued)

*Primary Examiner* — Mandrita Brahmachari
(74) *Attorney, Agent, or Firm* — Shumaker & Sieffert, PA

(57) ABSTRACT

A video encoder determines scaled transform coefficients, wherein determining the scaled transform coefficients comprises scaling transform coefficients of a block of the video data according to a given quantization step. The video encoder determines scalar quantized coefficients, wherein determining the scalar quantized coefficients comprises applying scalar quantization to the scaled transform coefficients of the block. Additionally, the video encoder applies a neural network that determines a respective set of probabilities for each respective transform coefficient of the block. The respective set of probabilities for the respective transform coefficient includes a respective probability value for each possible adjustment value in a plurality of possible adjustment values. Inputs to the neural network include the scaled transform coefficients and the scalar quantized coefficients. The video encoder determines, based on the set of
(Continued)

probabilities for a particular transform coefficient of the block, a quantization level for the particular transform coefficient.

27 Claims, 13 Drawing Sheets

(51) Int. Cl.
    *G06F 30/27*     (2020.01)
    *G06N 3/02*     (2006.01)
    *G06N 3/047*     (2023.01)
    *H04N 19/13*     (2014.01)
    *H04N 19/176*     (2014.01)
    *H04N 19/18*     (2014.01)
    *H04N 19/61*     (2014.01)

(52) U.S. Cl.
    CPC ........... *G06N 3/047* (2023.01); *H04N 19/124* (2014.11); *H04N 19/13* (2014.11); *H04N 19/18* (2014.11); *H04N 19/61* (2014.11); *H04Q 2213/13343* (2013.01); *H04Q 2213/343* (2013.01); *Y10S 706/00* (2013.01)

(56) References Cited

U.S. PATENT DOCUMENTS

| | | | | |
|---|---|---|---|---|
| 9,213,556 | B2 * | 12/2015 | Abiezzi | G06F 9/452 |
| 9,510,002 | B2 | 11/2016 | Tourapis et al. | |
| 9,521,410 | B2 | 12/2016 | Seregin et al. | |
| 9,560,386 | B2 | 1/2017 | Valin et al. | |
| 10,455,252 | B2 * | 10/2019 | Hong | H04N 19/176 |
| 2007/0140334 | A1 | 6/2007 | Sun | |
| 2008/0219354 | A1 | 9/2008 | Segall et al. | |
| 2010/0061449 | A1 | 3/2010 | Cote et al. | |
| 2012/0063691 | A1 | 3/2012 | Yu et al. | |
| 2012/0177109 | A1 | 7/2012 | Ye et al. | |
| 2015/0071344 | A1 | 3/2015 | Tourapis et al. | |
| 2015/0071345 | A1 | 3/2015 | Tourapis et al. | |
| 2019/0132591 | A1 * | 5/2019 | Zhang | H04N 19/59 |
| 2021/0099731 | A1 * | 4/2021 | Zhai | H04N 19/90 |

OTHER PUBLICATIONS

Snuba: Automating Weak Supervision to Label Training Data ; Author: Verma et al. (Year: 2019).*
Gong W., et al., "Progressive Image Transmission Using Self-Supervised Backpropagation Neural Network", Signals, Systems and Computers, 1991. 1991 Conference Record of the Twenty-Fifth Asilomar Conference on Pacific Grove, CA, USA Nov. 4-6, 1991, Los Alamitos, CA, USA, IEEE Comput, Soc, US, Nov. 4, 1991 (Nov. 4, 1991), XP010026476, pp. 1133-1137, DOI: 10.1109/ACSSC. 1991.186624 ISBN: 978-0-8186-2470-4 abstract section "3 Neural Transmission Sequence" section "4.2 Quantization".
International Search Report and Written Opinion—PCT/US2021/023680—ISA/EPO—Jun. 1, 2021 16 Pages.
Sullivan G., "Adaptive Quantization Rounding Offset", 14 JVT Meeting; 71. MPEG Meeting; Jan. 18, 2005-Jan. 21, 2005; Hong Kong, CN; (Joint Video Team of ISO/IEC JTC1/SC29/WG11 and ITU-T SG. 16), No. JVT-N011, Jan. 18, 2005-Jan. 21, 2005, 9 Pages, Jan. 13, 2005 (Jan. 13, 2005), XP030005934, the whole document.
Zhou M., et al., "Compact Representation of Quantization Matrices for HEVC", 4. JCT-VC Meeting; 95, MPEG Meeting; Jan. 20, 2011-Jan. 28, 2011; Daegu; Korea (Joint Collaborative Team on Video Coding of ISO/IEC JTC1/SC29/wg11 and ITU-T SG.16); URL: http://wftp3.itu.int/av-arch/jctvc-site/, Jan. 15, 2011, No. JCTVC-D024, Jan. 15, 2011 (Jan. 15, 2011), WG11 No. m18763, ISSN 0000-0015, XP030008065, pp. 1-9, the whole document.

Ma et al., "Image and Video Compression with Neural Networks: A Review", IEEE Transactions on Circuits and Systems for Video Technology, vol. 30, No. 6, Apr. 10, 2019, 16 pp.
Bengio Y., et al., "Modeling High-Dimensional Discrete Data with Multi-Layer Neural Networks", NIPS'99: Proceedings of the 12th International Conference on Neural Information Processing Systems, Nov. 1999, pp. 400-406.
Bross B., et al., "Versatile Video Coding (Draft 10)", JVET-S2001-vA, Joint Video Experts Team (JVET) of ITU-T SG 16 WP 3 and ISO/IEC JTC 1/SC 29/WG 11, 19th Meeting: by Teleconference, Jun. 22-Jul. 1, 2020, 550 Pages.
Bross B., et al., "Versatile Video Coding (Draft 8)", Joint Video Experts Team (JVET) of ITU-T SG 16 WP 3 and ISO/IEC JTC 1/SC 29/WG 11, 17th Meeting: Brussels, BE, Jan. 7-17, 2020, Document: JVET-Q2001-vE, 515 Pages.
Bross B., et al., "Versatile Video Coding (Draft 8)", Joint Video Experts Team (JVET) of ITU-T SG 16 WP 3 and ISO/IEC JTC 1/SC 29/WG 11, 17th Meeting, Brussels, BE, Jan. 7-17, 2020, JVET-Q2001-vA, 519 Pages.
Canh T.N., et al., "Rate-Distortion Optimized Quantization: A Deep Learning Approach", IEEE High Performance Extreme Computing Conference, 2018, 4 pages.
Chen J., et al., "Algorithm Description of Joint Exploration Test Model 1", 1. JVET Meeting, Oct. 19-21, 2015, Geneva (The Joint Video Exploration Team of ISO/IEC JTC1/SC29/WG11 and ITU-T SG.16 WP 3), No. JVET-A1001, Feb. 24, 2016 (Feb. 24, 2016), XP030150000, 27 Pages, URL: http://phenix.int-evry.fr/jvet/.
Chen Y., et al., "An Overview of Core Coding Tools in the AV1 Video Codec", Proceedings of 33rd Picture Coding Symposium, San Francisco, CA, Jun. 2018, 5 pages.
Guleryuz O.G., et al., "Non-Causal Encoding of Predictively Coded Samples", Proceedings of IEEE International Conference on Image Processing, Paris, France, Sep. 2014, pp. 4812-4816.
Hu J-H., et al., "Reinforcement Learning for HEVC/H.265 Intra-Frame Rate Control", IEEE International Symposium on Circuits and Systems (ISCAS), 2018, 5 pages.
Ioffe S., et al., "Batch Normalization: Accelerating Deep Network Training by Reducing Internal Covariate Shift", International Conference on Machine Learning, Mar. 2, 2015, pp. 1-11, arXiv:1502.03167v3.
ITU-T H.265, Series H: Audiovisual and Multimedia Systems, Infrastructure of Audiovisual Services—Coding of Moving Video, High Efficiency Video Coding, The International Telecommunication Union, Jun. 2019, 696 Pages.
Karczewicz M., et al., "Rate Distortion Optimized Quantization", 34th VCEG Meeting, 83rd MPEG Meeting, Dec. 1, 2008-Jan. 13, 2008, Antalya, Turkey (Video Coding Experts Group of ITU-T SG.16), No. VCEG-AH21, Jan. 9, 2008, XP030003559A, pp. 1-3, ISSN: 0000-0138.
Karczewicz M., et al., "R-D Based Quantization in H.264", Proceedings of SPIE, Applications of Digital Image Processing XXXII, San Diego, vol. 7443, Sep. 2009, pp. 744314-1-744314-8.
Kianfar D., et al., "Parallelized Rate-Distortion Optimized Quantization Using Deep Learning", IEEE, 2020, 5 pages.
Larochelle H., et al., "The Neural Autoregressive Distribution Estimator", Journal of Machine Learning Research, Jan. 2011, pp. 29-37.
Laude T., et al., "Deep Learning-Based Intra Prediction Mode Decision for HEVC", 2016 Picture Coding Symposium (PCS), IEEE, Dec. 2016, 6 Pages.
Long J., et al., "Fully Convolutional Networks for Semantic Segmentation", 2015 IEEE Conference on Computer Vision and Pattern Recognition (CVPR), vol. abs/1411.4038v2, Mar. 8, 2015 (Mar. 8, 2015), 10 pages, XP055294644, ISBN: 978-1-4673-6964-0 the whole document.
Mukherjee D., et al., "The Latest Open-Source Video Codec VP9—An Overview and Preliminary Results", Proceedings of 30th Picture Coding Symposium, San Jose, CA, Dec. 2013, 4 pages.
Pearlman W.A., et al., "Digital Signal Compression: Principles and Practice", Cambridge University Press, 2011, 439 pages.

(56) References Cited

OTHER PUBLICATIONS

Ramchandran K., et al., "Bit Allocation for Dependent Quantization with Applications to Multiresolution and MPEG Video Coders", IEEE Transactions on Image Processing, vol. 3, No. 5, Sep. 1994, pp. 533-545.

Ramchandran K., et al., "Rate-Distortion Optimal Fast Thresholding with Complete JPEG/MPEG Decoder Compatibility", IEEE Transactions on Image Processing, IEEE Service Center, Piscataway, NJ, US, vol. 3, No. 5, Sep. 1, 1994, pp. 700-704.

Richardson I.E., "The H.264 Advanced Video Compression Standard", Second Edition, John Wiley and Sons, Ltd., Aug. 9, 2010, 337 pages.

Said A., et al., "Improving Hybrid Coding via Control of Quantization Errors in the Spatial and Frequency Domains", Proceedings of IEEE International Conference on Image Processing, Paris, France, Sep. 2014, pp. 5621-5625.

Schaal S., et al., "Is Imitation Learning the Route to Humanoid Robots?", Trends in Cognitive Sciences, vol. 3, 1999, 233-242, 19 Pages.

Schwartz E., et al., "DeepISP: Toward Learning an End-to-End Image Processing Pipeline", IEEE Transactions on Image Processing, vol. 28, No. 2, Feb. 2019, pp. 912-923.

Srivastava, N., et al., "Dropout: A Simple Way to Prevent Neural Networks from Overfitting", Journal of Machine Learning Research, vol. 15, No. 1, Jun. 2014, pp. 1929-1958.

Sullivan G.J., et al., "On Dead-Zone Plus Uniform Threshold Scalar Quantization", Proceedings of SPIE 5960, Visual Communications and Image Processing, Beijing, China, vol. 5960, 2005, pp. 596033-1-596033-12.

Sullivan G.J., et al., "Overview of the High Efficiency Video Coding (HEVC) Standard", IEEE Transactions on Circuits and Systems for Video Technology, vol. 22, No. 12, Dec. 2012, pp. 1649-1668.

Taubman D., et al., "JPEG2000: Image Compression Fundamentals, Standards and Practice", Springer, 2002, 779 pages.

U.S. Appl. No. 17/166,639 filed Feb. 3, 2021.

Wiegand T., et al., "Lagrange Multiplier Selection in Hybrid Video Coder Control", Proceedings of IEEE International Conference on Image Processing, Thessaloniki, Greece, vol. 3, Oct. 2001, pp. 542-545.

Wien M., "High Efficiency Video Coding, Coding Tools and specification", Chapter 5, Springer-Verlag, Berlin, 2015, 30 pages.

Wiggers A., et al., "Predictive Sampling with Forecasting Autoregressive Models", Proceedings of the 37th International Conference on Machine Learning, 2020, 10 Pages.

Woods J.W., "Multidimensional Signal, Image, and Video Processing and Coding", 2nd ed., Academic Press, May 2011, 217 pages.

Xu M., et al., "Simplified Rate-Distortion Optimized Quantization for HEVC", IEEE International Symposium on Broadband Multimedia Systems and Broadcasting (BMSB), 2018, 5 Pages.

Xu M., et al., "Reducing Complexity of HEVC: A Deep Learning Approach", IEEE Transactions on Image Processing, Oct. 2018, pp. 1-17.

Zhang Z-T., et al., "Efficient CTU-based Intra Frame Coding for HEVC Based on Deep Learning", Proceedings of APSIPA Annual Summit and Conference 2017, Dec. 12-15, 2017, pp. 661-664.

Zhang, Y., et al., "Fast rate distortion optimized quantization for HEVC," In Proc. Visual Comm. Image Proces., pp. 1-4, 2015.

Cui, J., et al., "Hybrid laplace distribution-based low complexity rate-distortion optimized quantization," IEEE Transactions on Image Processing, vol. 26, No. 8, pp. 3802-3816, Aug. 2017.

Kingma, D. P., et al., "Adam: A method for stochastic optimization, "arXiv preprint arXiv:1412.6980, 2014. 4. D. Engelhardt, J. Moller, J. Hahlbeck, and B. Stabernack, "Fpga implementation of a full hd real-time hevc main profile decoder," IEEE Transactions on Consumer Electronics, vol. 60, No. 3, pp. 476-484, 2014.

Engelhardt, D., et al., "Fpga implementation of a full hd real-time hevc main profile decoder," IEEE Transactions on Consumer Electronics, vol. 60, No. 3, pp. 476-484, Aug. 2014.

Technical Information of EBU Test Sequences "Ebu uhd-1 test sequences," version 3.0, Geneva, Mar. 2015, downloaded from https://tech.ebu.ch/testsequences/uhd-1.

Bossen, F., et al., "JVET Common Test Conditions and Software Reference Configurations for SDR Video," JVET- N1010-v1, Joint Video Experts Team (JVET) of ITU-T SG 16 WP 3 and ISO/IEC JTC 1/SC 29/WG 11, 14th Meeting: Geneva, CH, Mar. 19-27, 2019, 6 Pages.

\* cited by examiner

PARALLELIZED RATE-DISTORTION OPTIMIZED QUANTIZATION USING DEEP LEARNING

This application claims the benefit of U.S. Provisional Patent Application 63/011,685, filed Apr. 17, 2020, and U.S. Provisional Patent Application 63/034,618, filed Jun. 4, 2020, the entire content of each of which is incorporated by reference.

TECHNICAL FIELD

This disclosure relates to video encoding and video decoding.

BACKGROUND

Digital video capabilities can be incorporated into a wide range of devices, including digital televisions, digital direct broadcast systems, wireless broadcast systems, personal digital assistants (PDAs), laptop or desktop computers, tablet computers, e-book readers, digital cameras, digital recording devices, digital media players, video gaming devices, video game consoles, cellular or satellite radio telephones, so-called "smart phones," video teleconferencing devices, video streaming devices, and the like. Digital video devices implement video coding techniques, such as those described in the standards defined by MPEG-2, MPEG-4, ITU-T H.263, ITU-T H.264/MPEG-4, Part 10, Advanced Video Coding (AVC), ITU-T H.265/High Efficiency Video Coding (HEVC), and extensions of such standards. The video devices may transmit, receive, encode, decode, and/or store digital video information more efficiently by implementing such video coding techniques.

Video coding techniques include spatial (intra-picture) prediction and/or temporal (inter-picture) prediction to reduce or remove redundancy inherent in video sequences. For block-based video coding, a video slice (e.g., a video picture or a portion of a video picture) may be partitioned into video blocks, which may also be referred to as coding tree units (CTUs), coding units (CUs) and/or coding nodes. Video blocks in an intra-coded (I) slice of a picture are encoded using spatial prediction with respect to reference samples in neighboring blocks in the same picture. Video blocks in an inter-coded (P or B) slice of a picture may use spatial prediction with respect to reference samples in neighboring blocks in the same picture or temporal prediction with respect to reference samples in other reference pictures. Pictures may be referred to as frames, and reference pictures may be referred to as reference frames.

SUMMARY

In general, this disclosure describes techniques for performing parallelized rate-distortion optimized quantization using deep learning. As described herein, a video encoder applies a neural network that determines, for each transform coefficient of a block, a set of probabilities for the transform coefficient. The video encoder may then determine, based on the set of probabilities for the transform coefficient, a quantization level for the transform coefficient. The video encoder may signal the determined quantization level for the transform coefficient.

In one example, a method includes a method of encoding video data, the method comprising: determining scaled transform coefficients, wherein determining the scaled transform coefficients comprises scaling transform coefficients of a block of the video data according to a given quantization step; determining scalar quantized coefficients, wherein determining the scalar quantized coefficients comprises applying scalar quantization to the scaled transform coefficients of the block; applying a neural network that determines a respective set of probabilities for each respective transform coefficient of the block, wherein: the respective set of probabilities for the respective transform coefficient includes a respective probability value for each possible adjustment value in a plurality of possible adjustment values, and inputs to the neural network include the scaled transform coefficients and the scalar quantized coefficients; determining, based on the set of probabilities for a particular transform coefficient of the block, a quantization level for the particular transform coefficient; and signaling, in a bitstream that includes an encoded representation of the video data, the determined quantization level for the particular transform coefficient.

In another example, this disclosure describes a device for encoding video data, the device comprising: a memory to store the video data; and one or more processors implemented in circuitry, the one or more processors configured to: determine scaled transform coefficients, wherein determining the scaled transform coefficients comprises scaling transform coefficients of a block of the video data according to a given quantization step; determine scalar quantized coefficients, wherein determining the scalar quantized coefficients comprises applying scalar quantization to the scaled transform coefficients of the block; apply a neural network that determines a respective set of probabilities for each respective transform coefficient of the block, wherein: the respective set of probabilities for the respective transform coefficient includes a respective probability value for each possible adjustment value in a plurality of possible adjustment values, and inputs to the neural network include the scaled transform coefficients and the scalar quantized coefficients; determine, based on the set of probabilities for a particular transform coefficient of the block, a quantization level for the particular transform coefficient; and signal, in a bitstream that includes an encoded representation of the video data, the determined quantization level for the particular transform coefficient.

In another example, this disclosure describes a device for encoding video data, the device comprising: means for determining scaled transform coefficients, wherein determining the scaled transform coefficients comprises scaling transform coefficients of a block of the video data according to a given quantization step; means for determining scalar quantized coefficients, wherein determining the scalar quantized coefficients comprises applying scalar quantization to the scaled transform coefficients of the block; means for applying a neural network that determines a respective set of probabilities for each respective transform coefficient of the block, wherein: the respective set of probabilities for the respective transform coefficient includes a respective probability value for each possible adjustment value in a plurality of possible adjustment values, and inputs to the neural network include the scaled transform coefficients and the scalar quantized coefficients; means for determining, based on the set of probabilities for a particular transform coefficient of the block, a quantization level for the particular transform coefficient; and means for signaling, in a bitstream that includes an encoded representation of the video data, the determined quantization level for the particular transform coefficient.

In another example, this disclosure describes a computer-readable storage medium having stored thereon instructions that, when executed, cause one or more processors to: determine scaled transform coefficients, wherein determining the scaled transform coefficients comprises scaling transform coefficients of a block of the video data according to a given quantization step; determine scalar quantized coefficients, wherein determining the scalar quantized coefficients comprises applying scalar quantization to the scaled transform coefficients of the block; apply a neural network that determines a respective set of probabilities for each respective transform coefficient of the block, wherein: the respective set of probabilities for the respective transform coefficient includes a respective probability value for each possible adjustment value in a plurality of possible adjustment values, and inputs to the neural network include the scaled transform coefficients and the scalar quantized coefficients; determine, based on the set of probabilities for a particular transform coefficient of the block, a quantization level for the particular transform coefficient; and signal, in a bitstream that includes an encoded representation of the video data, the determined quantization level for the particular transform coefficient.

The details of one or more examples are set forth in the accompanying drawings and the description below. Other features, objects, and advantages will be apparent from the description, drawings, and claims.

DETAILED DESCRIPTION

Rate distortion optimized quantization (RDOQ) is a quantization technique in which a video encoder selects quantization levels for individual transform coefficients of a block of video data. The video encoder may then signal the selected quantization levels. The process of selecting a quantization level for a transform coefficient may involve testing different quantization levels of the transform coefficient to determine a quantization level producing an optimal rate-distortion score for the transform coefficient. Performing such a search may be time consuming and resource intensive.

This disclosure describes techniques that may achieve results similar to RDOQ, but with greater efficiency and less resource consumption. As described herein, a video encoder may determine scaled transform coefficients. As part of determining the scaled transform coefficients, the video encoder may scale transform coefficients of a block of the video data according to a given quantization step. Furthermore, the video encoder may determine scalar quantized coefficients. As part of determining the scalar quantized coefficients, the video encoder may apply scalar quantization to the scaled transform coefficients of the block. Additionally, the video encoder may apply a neural network that determines a respective set of probabilities for each respective transform coefficient of the block. The respective set of probabilities for the respective transform coefficient includes a respective probability value for each possible adjustment value in a plurality of possible adjustment values. Inputs to the neural network may include the scaled transform coefficients and the scalar quantized coefficients. Furthermore, the video encoder may determine, based on the set of probabilities for a particular transform coefficient of the block, a quantization level for the particular transform coefficient. The video encoder may signal, in a bitstream that includes an encoded representation of the video data, the determined quantization level for the particular transform coefficient. Performing RDOQ in this way may accelerate the quantization process and may be less resource intensive.

Figure 1:
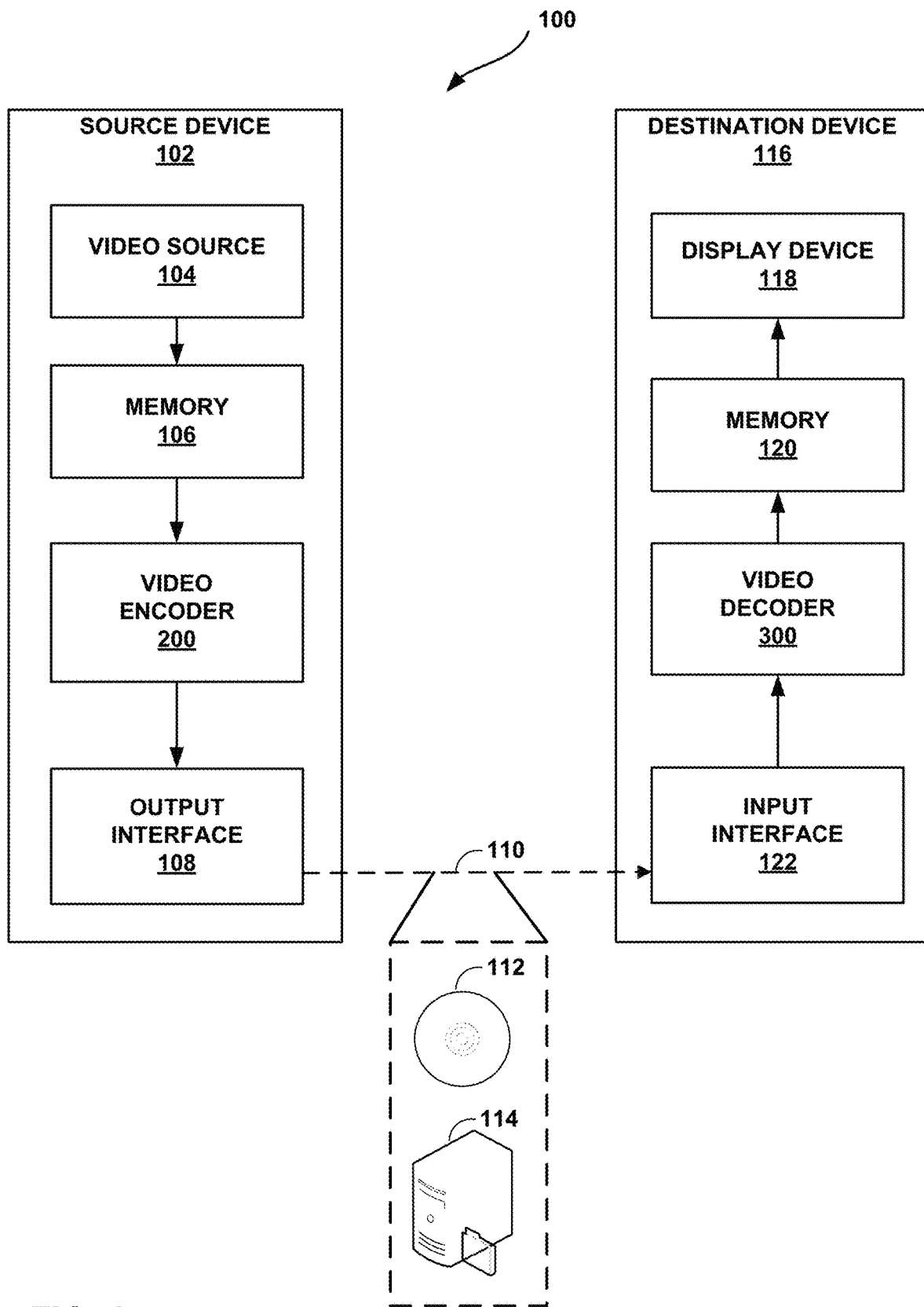
FIG. 1 is a block diagram illustrating an example video encoding and decoding system that may perform the techniques of this disclosure.

FIG. 1 is a block diagram illustrating an example video encoding and decoding system 100 that may perform the techniques of this disclosure. The techniques of this disclosure are generally directed to coding (encoding and/or decoding) video data. In general, video data includes any data for processing a video. Thus, video data may include raw, unencoded video, encoded video, decoded (e.g., reconstructed) video, and video metadata, such as signaling data.

As shown in FIG. 1, system 100 includes a source device 102 that provides encoded video data to be decoded and displayed by a destination device 116, in this example. In particular, source device 102 provides the video data to destination device 116 via a computer-readable medium 110. Source device 102 and destination device 116 may comprise any of a wide range of devices, including desktop computers, mobile devices (e.g., notebook (i.e., laptop) computers, tablet computers, telephone handsets such as smartphones, cameras), broadcast receiver devices, set-top boxes, televisions, display devices, digital media players, video gaming consoles, video streaming devices, or the like. In some cases, source device 102 and destination device 116 may be equipped for wireless communication, and thus may be referred to as wireless communication devices.

In the example of FIG. 1, source device 102 includes video source 104, memory 106, video encoder 200, and output interface 108. Destination device 116 includes input interface 122, video decoder 300, memory 120, and display device 118. In accordance with this disclosure, video encoder 200 of source device 102 and video decoder 300 of destination device 116 may be configured to apply the techniques for parallelized rate-distortion optimized quantization using deep learning. Thus, source device 102 represents an example of a video encoding device, while destination device 116 represents an example of a video decoding device. In other examples, a source device and a destination device may include other components or arrangements. For example, source device 102 may receive video data from an external video source, such as an external camera. Likewise, destination device 116 may interface with an external display device, rather than include an integrated display device.

System 100 as shown in FIG. 1 is merely one example. In general, any digital video encoding and/or decoding device may perform techniques for parallelized rate-distortion optimized quantization using deep learning. Source device 102 and destination device 116 are merely examples of such coding devices in which source device 102 generates coded video data for transmission to destination device 116. This disclosure refers to a "coding" device as a device that performs coding (encoding and/or decoding) of data. Thus, video encoder 200 and video decoder 300 represent examples of coding devices, in particular, a video encoder and a video decoder, respectively. In some examples, source device 102 and destination device 116 may operate in a substantially symmetrical manner such that each of source device 102 and destination device 116 includes video encoding and decoding components. Hence, system 100 may support one-way or two-way video transmission between source device 102 and destination device 116, e.g., for video streaming, video playback, video broadcasting, or video telephony.

In general, video source 104 represents a source of video data (i.e., raw, unencoded video data) and provides a sequential series of pictures (also referred to as "frames") of the video data to video encoder 200, which encodes data for the pictures. Video source 104 of source device 102 may include a video capture device, such as a video camera, a video archive containing previously captured raw video, and/or a video feed interface to receive video from a video content provider. As a further alternative, video source 104 may generate computer graphics-based data as the source video, or a combination of live video, archived video, and computer-generated video. In each case, video encoder 200 encodes the captured, pre-captured, or computer-generated video data. Video encoder 200 may rearrange the pictures from the received order (sometimes referred to as "display order") into a coding order for coding. Video encoder 200 may generate a bitstream including encoded video data. Source device 102 may then output the encoded video data via output interface 108 onto computer-readable medium 110 for reception and/or retrieval by, e.g., input interface 122 of destination device 116.

Memory 106 of source device 102 and memory 120 of destination device 116 represent general purpose memories. In some examples, memories 106, 120 may store raw video data, e.g., raw video from video source 104 and raw, decoded video data from video decoder 300. Additionally or alternatively, memories 106, 120 may store software instructions executable by, e.g., video encoder 200 and video decoder 300, respectively. Although memory 106 and memory 120 are shown separately from video encoder 200 and video decoder 300 in this example, it should be understood that video encoder 200 and video decoder 300 may also include internal memories for functionally similar or equivalent purposes. Furthermore, memories 106, 120 may store encoded video data, e.g., output from video encoder 200 and input to video decoder 300. In some examples, portions of memories 106, 120 may be allocated as one or more video buffers, e.g., to store raw, decoded, and/or encoded video data.

Computer-readable medium 110 may represent any type of medium or device capable of transporting the encoded video data from source device 102 to destination device 116. In one example, computer-readable medium 110 represents a communication medium to enable source device 102 to transmit encoded video data directly to destination device 116 in real-time, e.g., via a radio frequency network or computer-based network. Output interface 108 may demodulate a transmission signal including the encoded video data, and input interface 122 may demodulate the received transmission signal, according to a communication standard, such as a wireless communication protocol. The communication medium may comprise any wireless or wired communication medium, such as a radio frequency (RF) spectrum or one or more physical transmission lines. The communication medium may form part of a packet-based network, such as a local area network, a wide-area network, or a global network such as the Internet. The communication medium may include routers, switches, base stations, or any other equipment that may be useful to facilitate communication from source device 102 to destination device 116.

In some examples, source device 102 may output encoded data from output interface 108 to storage device 112. Similarly, destination device 116 may access encoded data from storage device 112 via input interface 122. Storage device 112 may include any of a variety of distributed or locally accessed data storage media such as a hard drive, Blu-ray discs, DVDs, CD-ROMs, flash memory, volatile or non-volatile memory, or any other suitable digital storage media for storing encoded video data.

In some examples, source device 102 may output encoded video data to file server 114 or another intermediate storage device that may store the encoded video data generated by source device 102. Destination device 116 may access stored video data from file server 114 via streaming or download. File server 114 may be any type of server device capable of storing encoded video data and transmitting that encoded video data to the destination device 116. File server 114 may represent a web server (e.g., for a website), a File Transfer Protocol (FTP) server, a content delivery network device, or a network attached storage (NAS) device. Destination device 116 may access encoded video data from file server 114 through any standard data connection, including an Internet connection. This may include a wireless channel (e.g., a Wi-Fi connection), a wired connection (e.g., digital subscriber line (DSL), cable modem, etc.), or a combination of both that is suitable for accessing encoded video data stored on file server 114. File server 114 and input interface 122 may be configured to operate according to a streaming transmission protocol, a download transmission protocol, or a combination thereof.

Output interface 108 and input interface 122 may represent wireless transmitters/receivers, modems, wired networking components (e.g., Ethernet cards), wireless communication components that operate according to any of a variety of IEEE 802.11 standards, or other physical components. In examples where output interface 108 and input interface 122 comprise wireless components, output interface 108 and input interface 122 may be configured to transfer data, such as encoded video data, according to a cellular communication standard, such as 4G, 4G-LTE (Long-Term Evolution), LTE Advanced, 5G, or the like. In some examples where output interface 108 comprises a wireless transmitter, output interface 108 and input interface 122 may be configured to transfer data, such as encoded video data, according to other wireless standards, such as an IEEE 802.11 specification, an IEEE 802.15 specification (e.g., ZigBee™), a Bluetooth™ standard, or the like. In some examples, source device 102 and/or destination device 116 may include respective system-on-a-chip (SoC) devices. For example, source device 102 may include an SoC device to perform the functionality attributed to video encoder 200 and/or output interface 108, and destination device 116 may include an SoC device to perform the functionality attributed to video decoder 300 and/or input interface 122.

The techniques of this disclosure may be applied to video coding in support of any of a variety of multimedia applications, such as over-the-air television broadcasts, cable television transmissions, satellite television transmissions, Internet streaming video transmissions, such as dynamic adaptive streaming over HTTP (DASH), digital video that is encoded onto a data storage medium, decoding of digital video stored on a data storage medium, or other applications.

Input interface 122 of destination device 116 receives an encoded video bitstream from computer-readable medium 110 (e.g., a communication medium, storage device 112, file server 114, or the like). The encoded video bitstream may include signaling information defined by video encoder 200, which is also used by video decoder 300, such as syntax elements having values that describe characteristics and/or processing of video blocks or other coded units (e.g., slices, pictures, groups of pictures, sequences, or the like). Display device 118 displays decoded pictures of the decoded video data to a user. Display device 118 may represent any of a variety of display devices such as a liquid crystal display (LCD), a plasma display, an organic light emitting diode (OLED) display, or another type of display device.

Although not shown in FIG. 1, in some examples, video encoder 200 and video decoder 300 may each be integrated with an audio encoder and/or audio decoder, and may include appropriate MUX-DEMUX units, or other hardware and/or software, to handle multiplexed streams including both audio and video in a common data stream. If applicable, MUX-DEMUX units may conform to the ITU H.223 multiplexer protocol, or other protocols such as the user datagram protocol (UDP).

Video encoder 200 and video decoder 300 each may be implemented as any of a variety of suitable encoder and/or decoder circuitry, such as one or more microprocessors, digital signal processors (DSPs), application specific integrated circuits (ASICs), field programmable gate arrays (FPGAs), discrete logic, software, hardware, firmware or any combinations thereof. When the techniques are implemented partially in software, a device may store instructions for the software in a suitable, non-transitory computer-readable medium and execute the instructions in hardware using one or more processors to perform the techniques of this disclosure. Each of video encoder 200 and video decoder 300 may be included in one or more encoders or decoders, either of which may be integrated as part of a combined encoder/decoder (CODEC) in a respective device. A device including video encoder 200 and/or video decoder 300 may comprise an integrated circuit, a microprocessor, and/or a wireless communication device, such as a cellular telephone.

Video encoder 200 and video decoder 300 may operate according to a video coding standard, such as ITU-T H.265, also referred to as High Efficiency Video Coding (HEVC) or extensions thereto, such as the multi-view and/or scalable video coding extensions. Alternatively, video encoder 200 and video decoder 300 may operate according to other proprietary or industry standards, such as ITU-T H.266, also referred to as Versatile Video Coding (VVC). A recent draft of the VVC standard is described in Bross, et al. "Versatile Video Coding (Draft 8)," Joint Video Experts Team (JVET) of ITU-T SG 16 WP 3 and ISO/IEC JTC 1/SC 29/WG 11, $17^{th}$ Meeting: Brussels, BE, 7-17 Jan. 2020, JVET-Q2001-vE (hereinafter "VVC Draft 8"). The techniques of this disclosure, however, are not limited to any particular coding standard.

In general, video encoder 200 and video decoder 300 may perform block-based coding of pictures. The term "block" generally refers to a structure including data to be processed (e.g., encoded, decoded, or otherwise used in the encoding and/or decoding process). For example, a block may include a two-dimensional matrix of samples of luminance and/or chrominance data. In general, video encoder 200 and video decoder 300 may code video data represented in a YUV (e.g., Y, Cb, Cr) format. That is, rather than coding red, green, and blue (RGB) data for samples of a picture, video encoder 200 and video decoder 300 may code luminance and chrominance components, where the chrominance components may include both red hue and blue hue chrominance components. In some examples, video encoder 200 converts received RGB formatted data to a YUV representation prior to encoding, and video decoder 300 converts the YUV representation to the RGB format. Alternatively, pre- and post-processing units (not shown) may perform these conversions.

This disclosure may generally refer to coding (e.g., encoding and decoding) of pictures to include the process of encoding or decoding data of the picture. Similarly, this disclosure may refer to coding of blocks of a picture to include the process of encoding or decoding data for the blocks, e.g., prediction and/or residual coding. An encoded video bitstream generally includes a series of values for syntax elements representative of coding decisions (e.g., coding modes) and partitioning of pictures into blocks. Thus, references to coding a picture or a block should generally be understood as coding values for syntax elements forming the picture or block.

HEVC defines various blocks, including coding units (CUs), prediction units (PUs), and transform units (TUs). According to HEVC, a video coder (such as video encoder 200) partitions a coding tree unit (CTU) into CUs according to a quadtree structure. That is, the video coder partitions CTUs and CUs into four equal, non-overlapping squares, and each node of the quadtree has either zero or four child nodes. Nodes without child nodes may be referred to as "leaf nodes," and CUs of such leaf nodes may include one or more PUs and/or one or more TUs. The video coder may further partition PUs and TUs. For example, in HEVC, a residual quadtree (RQT) represents partitioning of TUs. In HEVC, PUs represent inter-prediction data, while TUs represent residual data. CUs that are intra-predicted include intra-prediction information, such as an intra-mode indication.

As another example, video encoder 200 and video decoder 300 may be configured to operate according to VVC. According to VVC, a video coder (such as video encoder 200) partitions a picture into a plurality of coding tree units (CTUs). Video encoder 200 may partition a CTU according to a tree structure, such as a quadtree-binary tree (QTBT) structure or Multi-Type Tree (MTT) structure. The QTBT structure removes the concepts of multiple partition types, such as the separation between CUs, PUs, and TUs of HEVC. A QTBT structure includes two levels: a first level partitioned according to quadtree partitioning, and a second level partitioned according to binary tree partitioning. A root node of the QTBT structure corresponds to a CTU. Leaf nodes of the binary trees correspond to coding units (CUs).

In an MTT partitioning structure, blocks may be partitioned using a quadtree (QT) partition, a binary tree (BT) partition, and one or more types of triple tree (TT) (also called ternary tree (TT)) partitions. A triple or ternary tree partition is a partition where a block is split into three sub-blocks. In some examples, a triple or ternary tree partition divides a block into three sub-blocks without dividing the original block through the center. The partitioning types in MTT (e.g., QT, BT, and TT), may be symmetrical or asymmetrical.

In some examples, video encoder 200 and video decoder 300 may use a single QTBT or MTT structure to represent each of the luminance and chrominance components, while in other examples, video encoder 200 and video decoder 300 may use two or more QTBT or MTT structures, such as one QTBT/MTT structure for the luminance component and another QTBT/MTT structure for both chrominance components (or two QTBT/MTT structures for respective chrominance components).

Video encoder 200 and video decoder 300 may be configured to use quadtree partitioning per HEVC, QTBT partitioning, MTT partitioning, or other partitioning structures. For purposes of explanation, the description of the techniques of this disclosure is presented with respect to QTBT partitioning. However, it should be understood that the techniques of this disclosure may also be applied to video coders configured to use quadtree partitioning, or other types of partitioning as well.

In some examples, a CTU includes a coding tree block (CTB) of luma samples, two corresponding CTBs of chroma samples of a picture that has three sample arrays, or a CTB of samples of a monochrome picture or a picture that is coded using three separate color planes and syntax structures used to code the samples. A CTB may be an N×N block of samples for some value of N such that the division of a component into CTBs is a partitioning. A component is an array or single sample from one of the three arrays (luma and two chroma) that compose a picture in 4:2:0, 4:2:2, or 4:4:4 color format or the array or a single sample of the array that compose a picture in monochrome format. In some examples, a coding block is an M×N block of samples for some values of M and N such that a division of a CTB into coding blocks is a partitioning.

The blocks (e.g., CTUs or CUs) may be grouped in various ways in a picture. As one example, a brick may refer to a rectangular region of CTU rows within a particular tile in a picture. A tile may be a rectangular region of CTUs within a particular tile column and a particular tile row in a picture. A tile column refers to a rectangular region of CTUs having a height equal to the height of the picture and a width specified by syntax elements (e.g., such as in a picture parameter set). A tile row refers to a rectangular region of CTUs having a height specified by syntax elements (e.g., such as in a picture parameter set) and a width equal to the width of the picture.

In some examples, a tile may be partitioned into multiple bricks, each of which may include one or more CTU rows within the tile. A tile that is not partitioned into multiple bricks may also be referred to as a brick. However, a brick that is a true subset of a tile may not be referred to as a tile.

The bricks in a picture may also be arranged in a slice. A slice may be an integer number of bricks of a picture that may be exclusively contained in a single network abstraction layer (NAL) unit. In some examples, a slice includes either a number of complete tiles or only a consecutive sequence of complete bricks of one tile.

This disclosure may use "N×N" and "N by N" interchangeably to refer to the sample dimensions of a block (such as a CU or other video block) in terms of vertical and horizontal dimensions, e.g., 16×16 samples or 16 by 16 samples. In general, a 16×16 CU will have 16 samples in a vertical direction (y=16) and 16 samples in a horizontal direction (x=16). Likewise, an N×N CU generally has N samples in a vertical direction and N samples in a horizontal direction, where N represents a nonnegative integer value. The samples in a CU may be arranged in rows and columns. Moreover, CUs need not necessarily have the same number of samples in the horizontal direction as in the vertical direction. For example, CUs may comprise N×M samples, where M is not necessarily equal to N.

Video encoder 200 encodes video data for CUs representing prediction and/or residual information, and other information. The prediction information indicates how the CU is to be predicted in order to form a prediction block for the CU. The residual information generally represents sample-by-sample differences between samples of the CU prior to encoding and the prediction block.

To predict a CU, video encoder 200 may generally form a prediction block for the CU through inter-prediction or intra-prediction. Inter-prediction generally refers to predicting the CU from data of a previously coded picture, whereas intra-prediction generally refers to predicting the CU from previously coded data of the same picture. To perform inter-prediction, video encoder 200 may generate the prediction block using one or more motion vectors. Video encoder 200 may generally perform a motion search to identify a reference block that closely matches the CU, e.g., in terms of differences between the CU and the reference block. Video encoder 200 may calculate a difference metric using a sum of absolute difference (SAD), sum of squared differences (SSD), mean absolute difference (MAD), mean squared differences (MSD), or other such difference calculations to determine whether a reference block closely matches the current CU. In some examples, video encoder 200 may predict the current CU using uni-directional prediction or bi-directional prediction.

Some examples of VVC also provide an affine motion compensation mode, which may be considered an inter-prediction mode. In affine motion compensation mode, video encoder 200 may determine two or more motion vectors that represent non-translational motion, such as zoom in or out, rotation, perspective motion, or other irregular motion types.

To perform intra-prediction, video encoder 200 may select an intra-prediction mode to generate the prediction block. Some examples of VVC provide sixty-seven intra-prediction modes, including various directional modes, as well as planar mode and DC mode. In general, video encoder 200 selects an intra-prediction mode that describes neighboring samples to a current block (e.g., a block of a CU) from which to predict samples of the current block. Such samples may generally be above, above and to the left, or to the left of the current block in the same picture as the current block, assuming video encoder 200 codes CTUs and CUs in raster scan order (left to right, top to bottom).

Video encoder 200 encodes data representing the prediction mode for a current block. For example, for inter-prediction modes, video encoder 200 may encode data representing which of the various available inter-prediction modes is used, as well as motion information for the corresponding mode. For uni-directional or bi-directional inter-prediction, for example, video encoder 200 may encode motion vectors using advanced motion vector prediction (AMVP) or merge mode. Video encoder 200 may use similar modes to encode motion vectors for affine motion compensation mode.

Following prediction, such as intra-prediction or inter-prediction of a block, video encoder 200 may calculate residual data for the block. The residual data, such as a residual block, represents sample by sample differences between the block and a prediction block for the block, formed using the corresponding prediction mode. Video encoder 200 may apply one or more transforms to the residual block, to produce transformed data in a transform domain instead of the sample domain. For example, video encoder 200 may apply a discrete cosine transform (DCT), an integer transform, a wavelet transform, or a conceptually similar transform to residual video data. Additionally, video encoder 200 may apply a secondary transform following the first transform, such as a mode-dependent non-separable secondary transform (MDNSST), a signal dependent transform, a Karhunen-Loeve transform (KLT), or the like. Video encoder 200 produces transform coefficients following application of the one or more transforms.

As noted above, following any transforms to produce transform coefficients, video encoder 200 may perform quantization of the transform coefficients. Quantization generally refers to a process in which transform coefficients are quantized to possibly reduce the amount of data used to represent the transform coefficients, providing further compression. By performing the quantization process, video encoder 200 may reduce the bit depth associated with some or all of the transform coefficients. For example, video encoder 200 may round an n-bit value down to an m-bit value during quantization, where n is greater than m. In some examples, to perform quantization, video encoder 200 may perform a bitwise right-shift of the value to be quantized.

Following quantization, video encoder 200 may scan the transform coefficients, producing a one-dimensional vector from the two-dimensional matrix including the quantized transform coefficients. The scan may be designed to place higher energy (and therefore lower frequency) transform coefficients at the front of the vector and to place lower energy (and therefore higher frequency) transform coefficients at the back of the vector. In some examples, video encoder 200 may utilize a predefined scan order to scan the quantized transform coefficients to produce a serialized vector, and then entropy encode the quantized transform coefficients of the vector. In other examples, video encoder 200 may perform an adaptive scan. After scanning the quantized transform coefficients to form the one-dimensional vector, video encoder 200 may entropy encode the one-dimensional vector, e.g., according to context-adaptive binary arithmetic coding (CABAC). Video encoder 200 may also entropy encode values for syntax elements describing metadata associated with the encoded video data for use by video decoder 300 in decoding the video data.

To perform CABAC, video encoder 200 may assign a context within a context model to a symbol to be transmitted. The context may relate to, for example, whether neighboring values of the symbol are zero-valued or not. The probability determination may be based on a context assigned to the symbol.

Video encoder 200 may further generate syntax data, such as block-based syntax data, picture-based syntax data, and sequence-based syntax data, to video decoder 300, e.g., in a picture header, a block header, a slice header, or other syntax data, such as a sequence parameter set (SPS), picture parameter set (PPS), or video parameter set (VPS). Video decoder 300 may likewise decode such syntax data to determine how to decode corresponding video data.

In this manner, video encoder 200 may generate a bitstream including encoded video data, e.g., syntax elements describing partitioning of a picture into blocks (e.g., CUs) and prediction and/or residual information for the blocks. Ultimately, video decoder 300 may receive the bitstream and decode the encoded video data.

In general, video decoder 300 performs a reciprocal process to that performed by video encoder 200 to decode the encoded video data of the bitstream. For example, video decoder 300 may decode values for syntax elements of the bitstream using CABAC in a manner substantially similar to, albeit reciprocal to, the CABAC encoding process of video encoder 200. The syntax elements may define partitioning information for partitioning of a picture into CTUs, and partitioning of each CTU according to a corresponding partition structure, such as a QTBT structure, to define CUs of the CTU. The syntax elements may further define prediction and residual information for blocks (e.g., CUs) of video data.

The residual information may be represented by, for example, quantized transform coefficients. Video decoder 300 may inverse quantize and inverse transform the quantized transform coefficients of a block to reproduce a residual block for the block. Video decoder 300 uses a signaled prediction mode (intra- or inter-prediction) and related prediction information (e.g., motion information for inter-prediction) to form a prediction block for the block. Video decoder 300 may then combine the prediction block and the residual block (on a sample-by-sample basis) to reproduce the original block. Video decoder 300 may perform additional processing, such as performing a deblocking process to reduce visual artifacts along boundaries of the block.

Figure 2:
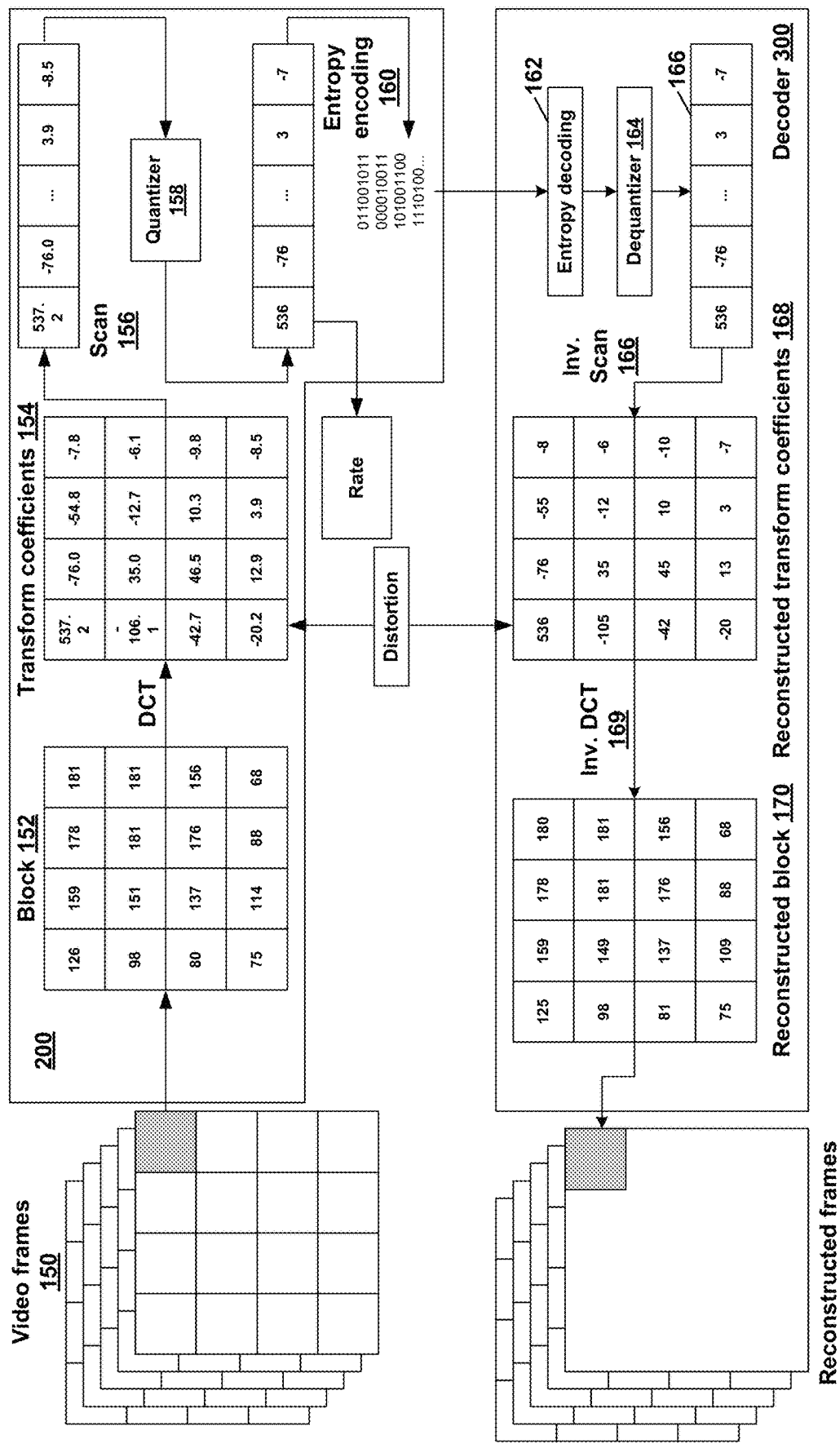
FIG. 2 is a conceptual diagram illustrating an example general schematic of a quantizer with a video encoder pipeline that may be used in High Efficiency Video Coding (HEVC), Versatile Video Coding (VVC), and/or other video coding standards.

FIG. 2 is a conceptual diagram illustrating an example general schematic of a quantizer with a video encoder pipeline and a video decoder pipeline, suitable for use in any of a variety of video coding processes such as, e.g., HEVC, VVC, and other video coding standards. Specifically, as shown in the example of FIG. 2, video encoder 200 receives video frames (pictures) 150. For each block of each of video frames 150, video encoder 200 may generate a block 152 of residual data. Video encoder 200 may then apply a transform (e.g., a DCT transform) to block 152 to generate a block of transform coefficients 154. Video encoder 200 may scan transform coefficients 154 (156). A quantizer 158 of video encoder 200 may quantize the scanned transform coefficients. Video encoder 200 may apply entropy encoding (160) to syntax elements representing the quantized transform coefficients.

Furthermore, in the example of FIG. 2, video decoder 300 may apply entropy decoding (162) to the entropy encoded syntax elements to determine the quantized transform coefficients. A dequantizer 164 of video decoder 300 may dequantize (i.e., inverse quantize) the quantized transform coefficients and apply an inverse scan 166 to determine inverse quantized transform coefficients 168. Video decoder 300 may apply an inverse transform (e.g., an inverse DCT) (169) to determine reconstructed transform coefficients 168. Video decoder 300 may then generate a reconstructed block 170 based on the reconstructed transform coefficients 168. Reconstructed block 170 may form part of a reconstructed frame in a set of reconstructed frames 172.

As noted above, video encoder 200 may perform quantization. Rate-Distortion Optimized Quantization (RDOQ) is one form of quantization. RDOQ has played an important role in the coding performance of recent video compression standards such as H.264/AVS, H.265/HEVC, VP9 and AV1. In practice, this scheme has yielded significant reductions in bitrate at the expense of permissible increases in distortion, as transform coefficients populate the large majority of the encoded bit-stream. However, optimizing for the multivariate RDOQ objective has been prohibitively expensive to implement on hardware due to two limitations: firstly, too many clock cycles are needed to discover optimal quantization levels per transform coefficient (TC) at encoding time, and secondly, common RDOQ algorithms are sequential in nature.

This disclosure may address both of these limitations through the use of a neural network-based approach that infers the quantization levels for many transform coefficients in a single forward-pass and furthermore is able to parallelize inference for many blocks, i.e., infer quantization levels for a plurality of blocks in parallel. The approach of this disclosure learns to trade-off rate and distortion during offline supervised training. In some examples, this disclosure is based solely on standard network operations that run on any existing graphical processing unit (GPU) or neural processing unit (NPU). Therefore, in some examples, no additional area-on-chip needs to be reserved as dedicated RDOQ circuitry.

In accordance with a technique of this disclosure, a computing system, such as a device, may train one or more classes of neural networks (e.g., a fully neural convolutional network and an autoregressive model) and may evaluate each as a post-quantization step designed to improve upon quantization schemes such as scalar quantization (SQ). Scalar quantization may be of the form $$q := \left\lfloor \frac{x}{s} \right\rfloor,$$

where x is a transform coefficient, s is a step size. In some examples, scalar quantization may be of the form $$q := \left\lfloor \frac{x}{s} + \epsilon \right\rfloor,$$

where x is a transform coefficient, s is a step size and $\epsilon$ is a quantization offset parameter. Furthermore, this disclosure describes a data collection algorithm for gathering high-quality labels. Both the fully convolutional model and autoregressive models may be designed to have low computational cost. This disclosure integrates the models in the HEVC reference model (HM) or models for other video coding standards, such as Versatile Video Coding (VVC).

In accordance with the techniques of this disclosure, video encoder 200 may determine scaled transform coefficients. Determining the scaled transform coefficients may include scaling transform coefficients of a block of the video data according to a given quantization step. Additionally, video encoder 200 may determine scalar quantized coefficients. Determining the scalar quantized coefficients may include applying scalar quantization to the scaled transform coefficients of the block. Subsequently, video encoder 200 may apply a neural network that determines a respective set of probabilities for each respective transform coefficient of the block. The respective set of probabilities for the respective transform coefficient includes a respective probability value for each possible adjustment value in a plurality of possible adjustment values. Inputs to the neural network include the scaled transform coefficients and the scalar quantized coefficients. Furthermore, video encoder 200 may determine, based on the set of probabilities for a particular transform coefficient of the block, a quantization level for the particular transform coefficient. Video encoder 200 may signal, in a bitstream that includes an encoded representation of the video data, the determined quantization level for the particular transform coefficient.

This disclosure may generally refer to "signaling" certain information, such as syntax elements. The term "signaling" may generally refer to the communication of values for syntax elements and/or other data used to decode encoded video data. That is, video encoder 200 may signal values for syntax elements in the bitstream. In general, signaling refers to generating a value in the bitstream. As noted above, source device 102 may transport the bitstream to destination device 116 substantially in real time, or not in real time, such as might occur when storing syntax elements to storage device 112 for later retrieval by destination device 116.

Figure 3:
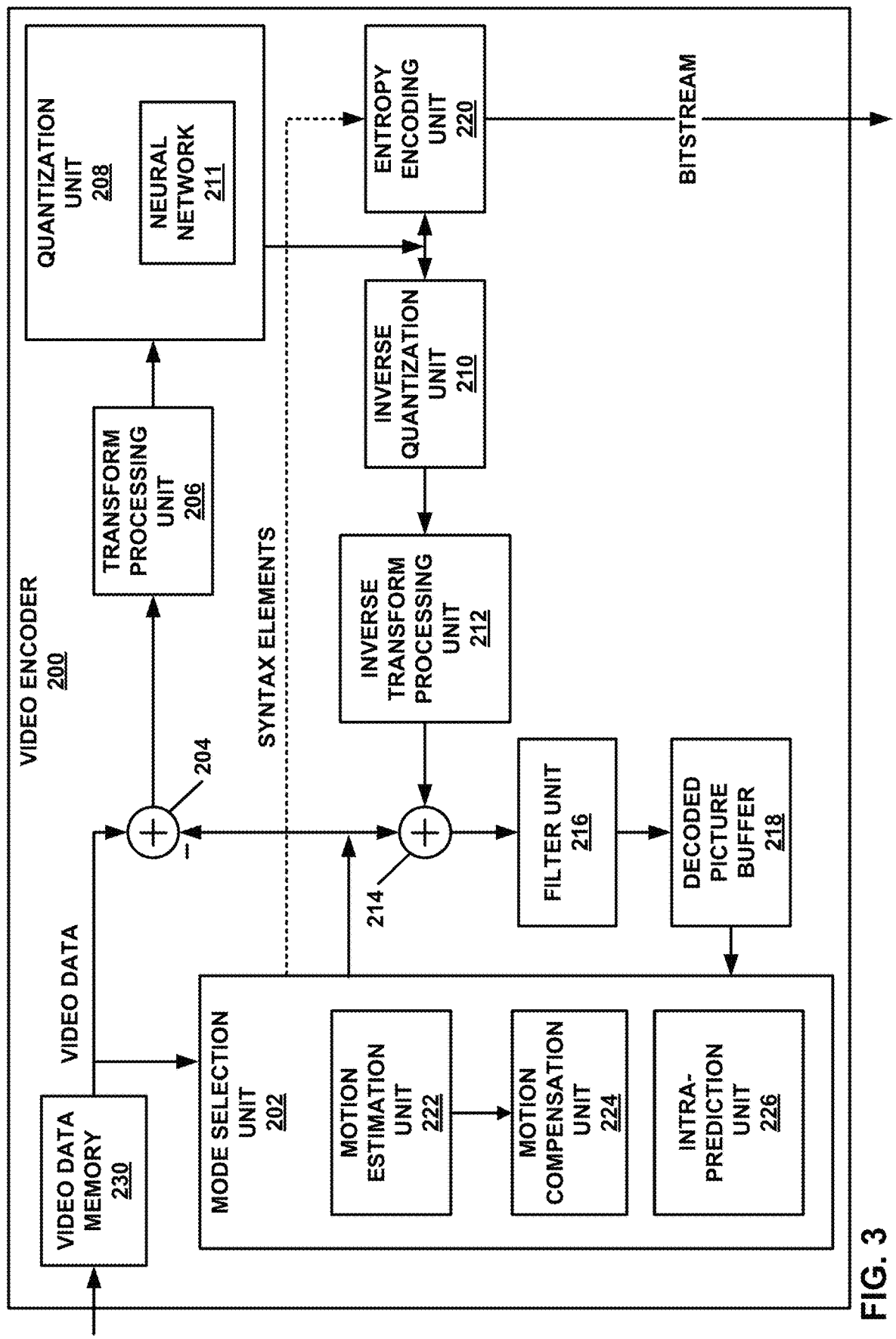
FIG. 3 is a block diagram illustrating an example video encoder that may perform the techniques of this disclosure.

FIG. 3 is a block diagram illustrating an example video encoder 200 that may perform the techniques of this disclosure. FIG. 3 is provided for purposes of explanation and should not be considered limiting of the techniques as broadly exemplified and described in this disclosure. For purposes of explanation, this disclosure describes video encoder 200 according to the techniques of VVC (ITU-T H.266, under development), and HEVC (ITU-T H.265). However, the techniques of this disclosure may be performed by video encoding devices that are configured to other video coding standards.

In the example of FIG. 3, video encoder 200 includes video data memory 230, mode selection unit 202, residual generation unit 204, transform processing unit 206, quantization unit 208, inverse quantization unit 210, inverse transform processing unit 212, reconstruction unit 214, filter unit 216, decoded picture buffer (DPB) 218, and entropy encoding unit 220. Furthermore, in the example of FIG. 3, quantization unit 208 includes a quantization unit 208 that includes a neural network 211. Any or all of video data memory 230, mode selection unit 202, residual generation unit 204, transform processing unit 206, quantization unit 208, inverse quantization unit 210, inverse transform processing unit 212, reconstruction unit 214, filter unit 216, DPB 218, entropy encoding unit 220, quantization unit 208, and neural network 211 may be implemented in one or more processors or in processing circuitry. For instance, the units of video encoder 200 may be implemented as one or more circuits or logic elements as part of hardware circuitry, or as part of a processor, ASIC, of FPGA. Moreover, video encoder 200 may include additional or alternative processors or processing circuitry to perform these and other functions.

Video data memory 230 may store video data to be encoded by the components of video encoder 200. Video encoder 200 may receive the video data stored in video data memory 230 from, for example, video source 104 (FIG. 1). DPB 218 may act as a reference picture memory that stores reference video data for use in prediction of subsequent video data by video encoder 200. Video data memory 230 and DPB 218 may be formed by any of a variety of memory devices, such as dynamic random access memory (DRAM), including synchronous DRAM (SDRAM), magnetoresistive RAM (MRAM), resistive RAM (RRAM), or other types of memory devices. Video data memory 230 and DPB 218 may be provided by the same memory device or separate memory devices. In various examples, video data memory 230 may be on-chip with other components of video encoder 200, as illustrated, or off-chip relative to those components.

In this disclosure, reference to video data memory 230 should not be interpreted as being limited to memory internal to video encoder 200, unless specifically described as such, or memory external to video encoder 200, unless specifically described as such. Rather, reference to video data memory 230 should be understood as reference memory that stores video data that video encoder 200 receives for encoding (e.g., video data for a current block that is to be encoded). Memory 106 of FIG. 1 may also provide temporary storage of outputs from the various units of video encoder 200.

The various units of FIG. 3 are illustrated to assist with understanding the operations performed by video encoder 200. The units may be implemented as fixed-function circuits, programmable circuits, or a combination thereof. Fixed-function circuits refer to circuits that provide particular functionality and are preset on the operations that can be performed. Programmable circuits refer to circuits that can be programmed to perform various tasks and provide flexible functionality in the operations that can be performed. For instance, programmable circuits may execute software or firmware that cause the programmable circuits to operate in the manner defined by instructions of the software or firmware. Fixed-function circuits may execute software instructions (e.g., to receive parameters or output parameters), but the types of operations that the fixed-function circuits perform are generally immutable. In some examples, one or more of the units may be distinct circuit blocks (fixed-function or programmable), and in some examples, one or more of the units may be integrated circuits.

Video encoder 200 may include arithmetic logic units (ALUs), elementary function units (EFUs), digital circuits, analog circuits, and/or programmable cores, formed from programmable circuits. In examples where the operations of video encoder 200 are performed using software executed by the programmable circuits, memory 106 (FIG. 1) may store the instructions (e.g., object code) of the software that video encoder 200 receives and executes, or another memory within video encoder 200 (not shown) may store such instructions.

Video data memory 230 is configured to store received video data. Video encoder 200 may retrieve a picture of the video data from video data memory 230 and provide the video data to residual generation unit 204 and mode selection unit 202. Video data in video data memory 230 may be raw video data that is to be encoded.

Mode selection unit 202 includes a motion estimation unit 222, a motion compensation unit 224, and an intra-prediction unit 226. Mode selection unit 202 may include additional functional units to perform video prediction in accordance with other prediction modes. As examples, mode selection unit 202 may include a palette unit, an intra-block copy unit (which may be part of motion estimation unit 222 and/or motion compensation unit 224), an affine unit, a linear model (LM) unit, or the like.

Mode selection unit 202 generally coordinates multiple encoding passes to test combinations of encoding parameters and resulting rate-distortion values for such combinations. The encoding parameters may include partitioning of CTUs into CUs, prediction modes for the CUs, transform types for residual data of the CUs, quantization parameters for residual data of the CUs, and so on. Mode selection unit 202 may ultimately select the combination of encoding parameters having rate-distortion values that are better than the other tested combinations.

Video encoder 200 may partition a picture retrieved from video data memory 230 into a series of CTUs and encapsulate one or more CTUs within a slice. Mode selection unit 202 may partition a CTU of the picture in accordance with a tree structure, such as the QTBT structure or the quad-tree structure of HEVC described above. As described above, video encoder 200 may form one or more CUs from partitioning a CTU according to the tree structure. Such a CU may also be referred to generally as a "video block" or "block."

In general, mode selection unit 202 also controls the components thereof (e.g., motion estimation unit 222, motion compensation unit 224, and intra-prediction unit 226) to generate a prediction block for a current block (e.g., a current CU, or in HEVC, the overlapping portion of a PU and a TU). For inter-prediction of a current block, motion estimation unit 222 may perform a motion search to identify one or more closely matching reference blocks in one or more reference pictures (e.g., one or more previously coded pictures stored in DPB 218). In particular, motion estimation unit 222 may calculate a value representative of how similar a potential reference block is to the current block, e.g., according to sum of absolute difference (SAD), sum of squared differences (SSD), mean absolute difference (MAD), mean squared differences (MSD), or the like. Motion estimation unit 222 may generally perform these calculations using sample-by-sample differences between the current block and the reference block being considered. Motion estimation unit 222 may identify a reference block having a lowest value resulting from these calculations, indicating a reference block that most closely matches the current block.

Motion estimation unit 222 may form one or more motion vectors (MVs) that defines the positions of the reference blocks in the reference pictures relative to the position of the current block in a current picture. Motion estimation unit 222 may then provide the motion vectors to motion compensation unit 224. For example, for uni-directional inter-prediction, motion estimation unit 222 may provide a single motion vector, whereas for bi-directional inter-prediction, motion estimation unit 222 may provide two motion vectors. Motion compensation unit 224 may then generate a prediction block using the motion vectors. For example, motion compensation unit 224 may retrieve data of the reference block using the motion vector. As another example, if the motion vector has fractional sample precision, motion compensation unit 224 may interpolate values for the prediction block according to one or more interpolation filters. Moreover, for bi-directional inter-prediction, motion compensation unit 224 may retrieve data for two reference blocks identified by respective motion vectors and combine the retrieved data, e.g., through sample-by-sample averaging or weighted averaging.

As another example, for intra-prediction, or intra-prediction coding, intra-prediction unit 226 may generate the prediction block from samples neighboring the current block. For example, for directional modes, intra-prediction unit 226 may generally mathematically combine values of neighboring samples and populate these calculated values in the defined direction across the current block to produce the prediction block. As another example, for DC mode, intra-prediction unit 226 may calculate an average of the neighboring samples to the current block and generate the prediction block to include this resulting average for each sample of the prediction block.

Mode selection unit 202 provides the prediction block to residual generation unit 204. Residual generation unit 204 receives a raw, unencoded version of the current block from video data memory 230 and the prediction block from mode selection unit 202. Residual generation unit 204 calculates sample-by-sample differences between the current block and the prediction block. The resulting sample-by-sample differences define a residual block for the current block. In some examples, residual generation unit 204 may also determine differences between sample values in the residual block to generate a residual block using residual differential pulse code modulation (RDPCM). In some examples, residual generation unit 204 may be formed using one or more subtractor circuits that perform binary subtraction.

In examples where mode selection unit 202 partitions CUs into PUs, each PU may be associated with a luma prediction unit and corresponding chroma prediction units. Video encoder 200 and video decoder 300 may support PUs having various sizes. As indicated above, the size of a CU may refer to the size of the luma coding block of the CU and the size of a PU may refer to the size of a luma prediction unit of the PU. Assuming that the size of a particular CU is 2N×2N, video encoder 200 may support PU sizes of 2N×2N or N×N for intra prediction, and symmetric PU sizes of 2N×2N, 2N×N, N×2N, N×N, or similar for inter prediction. Video encoder 200 and video decoder 300 may also support asymmetric partitioning for PU sizes of 2N×nU, 2N×nD, nL×2N, and nR×2N for inter prediction.

In examples where mode selection unit 202 does not further partition a CU into PUs, each CU may be associated with a luma coding block and corresponding chroma coding blocks. As above, the size of a CU may refer to the size of the luma coding block of the CU. The video encoder 200 and video decoder 300 may support CU sizes of 2N×2N, 2N×N, or N×2N.

For other video coding techniques such as an intra-block copy mode coding, an affine-mode coding, and linear model (LM) mode coding, as a few examples, mode selection unit 202, via respective units associated with the coding techniques, generates a prediction block for the current block being encoded. In some examples, such as palette mode coding, mode selection unit 202 may not generate a prediction block, and instead generate syntax elements that indicate the manner in which to reconstruct the block based on a selected palette. In such modes, mode selection unit 202 may provide these syntax elements to entropy encoding unit 220 to be encoded.

As described above, residual generation unit 204 receives the video data for the current block and the corresponding prediction block. Residual generation unit 204 then generates a residual block for the current block. To generate the residual block, residual generation unit 204 calculates sample-by-sample differences between the prediction block and the current block.

Transform processing unit 206 applies one or more transforms to the residual block to generate a block of transform coefficients (referred to herein as a "transform coefficient block"). Transform processing unit 206 may apply various transforms to a residual block to form the transform coefficient block. For example, transform processing unit 206 may apply a discrete cosine transform (DCT), a directional transform, a Karhunen-Loeve transform (KLT), or a conceptually similar transform to a residual block. In some examples, transform processing unit 206 may perform multiple transforms to a residual block, e.g., a primary transform and a secondary transform, such as a rotational transform. In some examples, transform processing unit 206 does not apply transforms to a residual block.

Quantization unit 208 may quantize the transform coefficients in a transform coefficient block, to produce a quantized transform coefficient block. Quantization unit 208 may quantize transform coefficients of a transform coefficient block according to a quantization parameter (QP) value associated with the current block. Video encoder 200 (e.g., via mode selection unit 202) may adjust the degree of quantization applied to the transform coefficient blocks associated with the current block by adjusting the QP value associated with the CU. Quantization may introduce loss of information, and thus, quantized transform coefficients may have lower precision than the original transform coefficients produced by transform processing unit 206.

In accordance with one or more techniques of this disclosure, quantization unit 208 of quantization unit 208 may determine scaled transform coefficients. Determining the scaled transform coefficients may comprise scaling transform coefficients of a block of the video data according to a given quantization step. Additionally, quantization unit 208 may determine scalar quantized coefficients. Determining the scalar quantized coefficients may comprise applying scalar quantization to the scaled transform coefficients of the block. Additionally, quantization unit 208 may apply neural network 211 to determine a respective set of probabilities for each respective transform coefficient of the block. The respective set of probabilities for the respective transform coefficient includes a respective probability value for each possible adjustment value in a plurality of possible adjustment values. Inputs to neural network 211 may include the scaled transform coefficients and the scalar quantized coefficients. Quantization unit 208 may determine, based on the set of probabilities for a particular transform coefficient of the block, a quantization level for the particular transform coefficient.

Inverse quantization unit 210 and inverse transform processing unit 212 may apply inverse quantization and inverse transforms to a quantized transform coefficient block, respectively, to reconstruct a residual block from the transform coefficient block. Reconstruction unit 214 may produce a reconstructed block corresponding to the current block (albeit potentially with some degree of distortion) based on the reconstructed residual block and a prediction block generated by mode selection unit 202. For example, reconstruction unit 214 may add samples of the reconstructed residual block to corresponding samples from the prediction block generated by mode selection unit 202 to produce the reconstructed block.

Filter unit 216 may perform one or more filter operations on reconstructed blocks. For example, filter unit 216 may perform deblocking operations to reduce blockiness artifacts along edges of CUs. Operations of filter unit 216 may be skipped, in some examples.

Video encoder 200 stores reconstructed blocks in DPB 218. For instance, in examples where operations of filter unit 216 are not needed, reconstruction unit 214 may store reconstructed blocks to DPB 218. In examples where operations of filter unit 216 are needed, filter unit 216 may store the filtered reconstructed blocks to DPB 218. Motion estimation unit 222 and motion compensation unit 224 may retrieve a reference picture from DPB 218, formed from the reconstructed (and potentially filtered) blocks, to inter-predict blocks of subsequently encoded pictures. In addition, intra-prediction unit 226 may use reconstructed blocks in DPB 218 of a current picture to intra-predict other blocks in the current picture.

In general, entropy encoding unit 220 may entropy encode syntax elements received from other functional components of video encoder 200. For example, entropy encoding unit 220 may entropy encode quantized transform coefficient blocks from quantization unit 208. As another example, entropy encoding unit 220 may entropy encode prediction syntax elements (e.g., motion information for inter-prediction or intra-mode information for intra-prediction) from mode selection unit 202. Entropy encoding unit 220 may perform one or more entropy encoding operations on the syntax elements, which are another example of video data, to generate entropy-encoded data. For example, entropy encoding unit 220 may perform a context-adaptive variable length coding (CAVLC) operation, a CABAC operation, a variable-to-variable (V2V) length coding operation, a syntax-based context-adaptive binary arithmetic coding (SBAC) operation, a Probability Interval Partitioning Entropy (PIPE) coding operation, an Exponential-Golomb encoding operation, or another type of entropy encoding operation on the data. In some examples, entropy encoding unit 220 may operate in bypass mode where syntax elements are not entropy encoded.

Video encoder 200 may output a bitstream that includes the entropy encoded syntax elements needed to reconstruct blocks of a slice or picture. In particular, entropy encoding unit 220 may output the bitstream.

The operations described above are described with respect to a block. Such description should be understood as being operations for a luma coding block and/or chroma coding blocks. As described above, in some examples, the luma coding block and chroma coding blocks are luma and chroma components of a CU. In some examples, the luma coding block and the chroma coding blocks are luma and chroma components of a PU.

In some examples, operations performed with respect to a luma coding block need not be repeated for the chroma coding blocks. As one example, operations to identify a motion vector (MV) and reference picture for a luma coding block need not be repeated for identifying an MV and reference picture for the chroma blocks. Rather, the MV for the luma coding block may be scaled to determine the MV for the chroma blocks, and the reference picture may be the same. As another example, the intra-prediction process may be the same for the luma coding block and the chroma coding blocks.

In this way, video encoder 200 represents an example of a device configured to encode video data including a memory configured to store video data, and one or more processing units implemented in circuitry and configured to determine scaled transform coefficients, wherein determining the scaled transform coefficients comprises scaling transform coefficients of a block of the video data according to a given quantization step; determine scalar quantized coefficients, wherein determining the scalar quantized coefficients comprises applying scalar quantization to the scaled transform coefficients of the block; apply a neural network that determines a respective set of probabilities for each respective transform coefficient of the block, wherein: the respective set of probabilities for the respective transform coefficient includes a respective probability value for each possible adjustment value in a plurality of possible adjustment values, and inputs to the neural network include the scaled transform coefficients and the scalar quantized coefficients; determine, based on the set of probabilities for a particular transform coefficient of the block, a quantization level for the particular transform coefficient; and signal, in a bitstream that includes an encoded representation of the video data, the determined quantization level for the particular transform coefficient.

Figure 4:
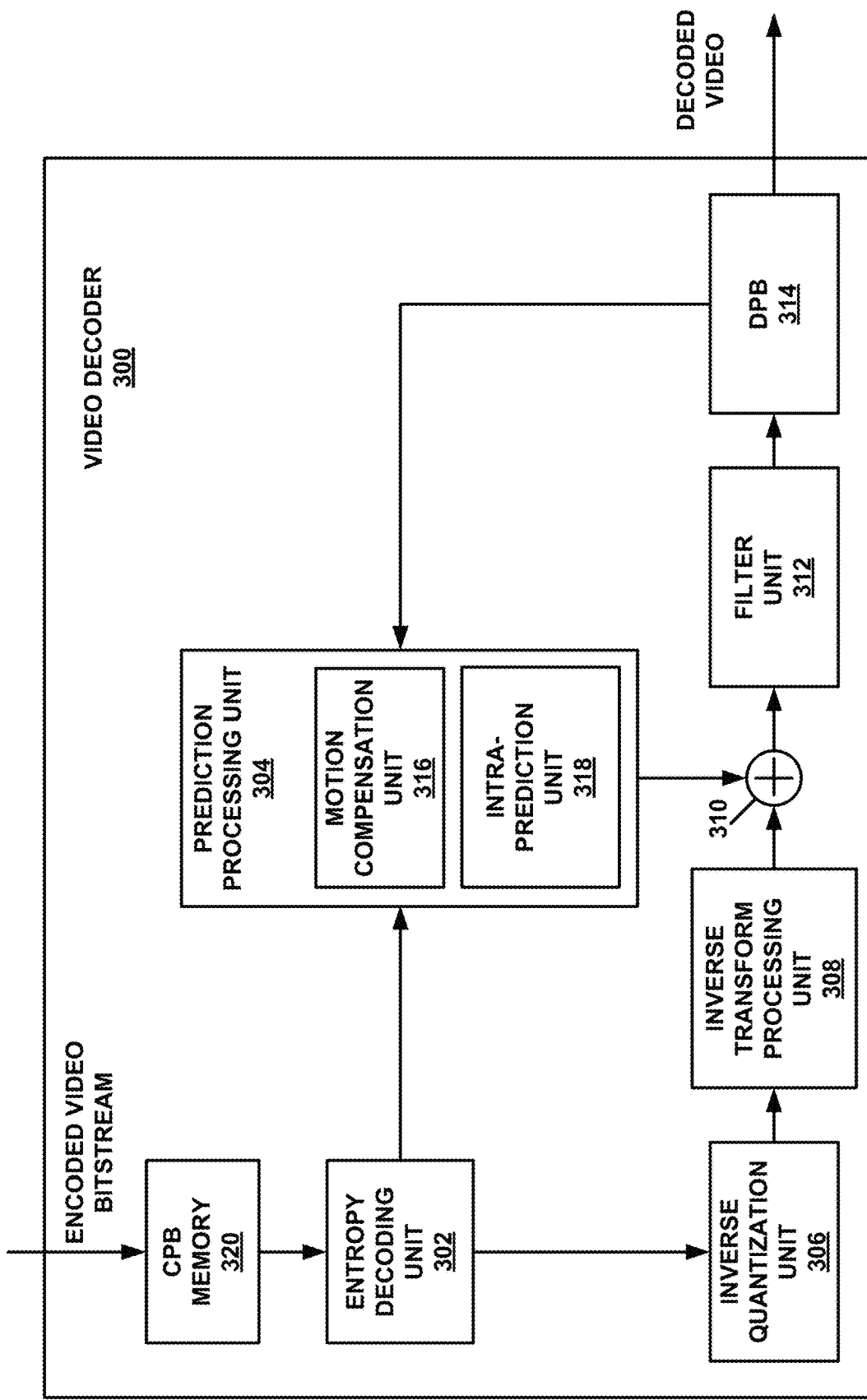
FIG. 4 is a block diagram illustrating an example video decoder that may perform the techniques of this disclosure.

FIG. 4 is a block diagram illustrating an example video decoder 300 that may perform the techniques of this disclosure. FIG. 4 is provided for purposes of explanation and is not limiting on the techniques as broadly exemplified and described in this disclosure. For purposes of explanation, this disclosure describes video decoder 300 according to the techniques of VVC (ITU-T H.266, under development), and HEVC (ITU-T H.265). However, the techniques of this disclosure may be performed by video coding devices that are configured to other video coding standards.

In the example of FIG. 4, video decoder 300 includes coded picture buffer (CPB) memory 320, entropy decoding unit 302, prediction processing unit 304, inverse quantization unit 306, inverse transform processing unit 308, reconstruction unit 310, filter unit 312, and decoded picture buffer (DPB) 314. Any or all of CPB memory 320, entropy decoding unit 302, prediction processing unit 304, inverse quantization unit 306, inverse transform processing unit 308, reconstruction unit 310, filter unit 312, and DPB 314 may be implemented in one or more processors or in processing circuitry. For instance, the units of video decoder 300 may be implemented as one or more circuits or logic elements as part of hardware circuitry, or as part of a processor, ASIC, of FPGA. Moreover, video decoder 300 may include additional or alternative processors or processing circuitry to perform these and other functions.

Prediction processing unit 304 includes motion compensation unit 316 and intra-prediction unit 318. Prediction processing unit 304 may include additional units to perform prediction in accordance with other prediction modes. As examples, prediction processing unit 304 may include a palette unit, an intra-block copy unit (which may form part of motion compensation unit 316), an affine unit, a linear model (LM) unit, or the like. In other examples, video decoder 300 may include more, fewer, or different functional components.

CPB memory 320 may store video data, such as an encoded video bitstream, to be decoded by the components of video decoder 300. The video data stored in CPB memory 320 may be obtained, for example, from computer-readable medium 110 (FIG. 1). CPB memory 320 may include a CPB that stores encoded video data (e.g., syntax elements) from an encoded video bitstream. Also, CPB memory 320 may store video data other than syntax elements of a coded picture, such as temporary data representing outputs from the various units of video decoder 300. DPB 314 generally stores decoded pictures, which video decoder 300 may output and/or use as reference video data when decoding subsequent data or pictures of the encoded video bitstream. CPB memory 320 and DPB 314 may be formed by any of a variety of memory devices, such as DRAM, including SDRAM, MRAM, RRAM, or other types of memory devices. CPB memory 320 and DPB 314 may be provided by the same memory device or separate memory devices. In various examples, CPB memory 320 may be on-chip with other components of video decoder 300, or off-chip relative to those components.

Additionally or alternatively, in some examples, video decoder 300 may retrieve coded video data from memory 120 (FIG. 1). That is, memory 120 may store data as discussed above with CPB memory 320. Likewise, memory 120 may store instructions to be executed by video decoder 300, when some or all of the functionality of video decoder 300 is implemented in software to be executed by processing circuitry of video decoder 300.

The various units shown in FIG. 4 are illustrated to assist with understanding the operations performed by video decoder 300. The units may be implemented as fixed-function circuits, programmable circuits, or a combination thereof. Similar to FIG. 3, fixed-function circuits refer to circuits that provide particular functionality, and are preset on the operations that can be performed. Programmable circuits refer to circuits that can be programmed to perform various tasks and provide flexible functionality in the operations that can be performed. For instance, programmable circuits may execute software or firmware that cause the programmable circuits to operate in the manner defined by instructions of the software or firmware. Fixed-function circuits may execute software instructions (e.g., to receive parameters or output parameters), but the types of operations that the fixed-function circuits perform are generally immutable. In some examples, one or more of the units may be distinct circuit blocks (fixed-function or programmable), and in some examples, one or more of the units may be integrated circuits.

Video decoder 300 may include ALUs, EFUs, digital circuits, analog circuits, and/or programmable cores formed from programmable circuits. In examples where the operations of video decoder 300 are performed by software executing on the programmable circuits, on-chip or off-chip memory may store instructions (e.g., object code) of the software that video decoder 300 receives and executes.

Entropy decoding unit 302 may receive encoded video data from the CPB and entropy decode the video data to reproduce syntax elements. Prediction processing unit 304, inverse quantization unit 306, inverse transform processing unit 308, reconstruction unit 310, and filter unit 312 may generate decoded video data based on the syntax elements extracted from the bitstream.

In general, video decoder 300 reconstructs a picture on a block-by-block basis. Video decoder 300 may perform a reconstruction operation on each block individually (where the block currently being reconstructed, i.e., decoded, may be referred to as a "current block").

Entropy decoding unit 302 may entropy decode syntax elements defining quantized transform coefficients of a quantized transform coefficient block, as well as transform information, such as a quantization parameter (QP) and/or transform mode indication(s). Inverse quantization unit 306 may use the QP associated with the quantized transform coefficient block to determine a degree of quantization and, likewise, a degree of inverse quantization for inverse quantization unit 306 to apply. Inverse quantization unit 306 may, for example, perform a bitwise left-shift operation to inverse quantize the quantized transform coefficients. Inverse quantization unit 306 may thereby form a transform coefficient block including transform coefficients.

After inverse quantization unit 306 forms the transform coefficient block, inverse transform processing unit 308 may apply one or more inverse transforms to the transform coefficient block to generate a residual block associated with the current block. For example, inverse transform processing unit 308 may apply an inverse DCT, an inverse integer transform, an inverse Karhunen-Loeve transform (KLT), an inverse rotational transform, an inverse directional transform, or another inverse transform to the transform coefficient block.

Furthermore, prediction processing unit 304 generates a prediction block according to prediction information syntax elements that were entropy decoded by entropy decoding unit 302. For example, if the prediction information syntax elements indicate that the current block is inter-predicted, motion compensation unit 316 may generate the prediction block. In this case, the prediction information syntax elements may indicate a reference picture in DPB 314 from which to retrieve a reference block, as well as a motion vector identifying a location of the reference block in the reference picture relative to the location of the current block in the current picture. Motion compensation unit 316 may generally perform the inter-prediction process in a manner that is substantially similar to that described with respect to motion compensation unit 224 (FIG. 3).

As another example, if the prediction information syntax elements indicate that the current block is intra-predicted, intra-prediction unit 318 may generate the prediction block according to an intra-prediction mode indicated by the prediction information syntax elements. Again, intra-prediction unit 318 may generally perform the intra-prediction process in a manner that is substantially similar to that described with respect to intra-prediction unit 226 (FIG. 3). Intra-prediction unit 318 may retrieve data of neighboring samples to the current block from DPB 314.

Reconstruction unit 310 may reconstruct the current block using the prediction block and the residual block. For example, reconstruction unit 310 may add samples of the residual block to corresponding samples of the prediction block to reconstruct the current block.

Filter unit 312 may perform one or more filter operations on reconstructed blocks. For example, filter unit 312 may perform deblocking operations to reduce blockiness artifacts along edges of the reconstructed blocks. Operations of filter unit 312 are not necessarily performed in all examples.

Video decoder 300 may store the reconstructed blocks in DPB 314. For instance, in examples where operations of filter unit 312 are not performed, reconstruction unit 310 may store reconstructed blocks to DPB 314. In examples where operations of filter unit 312 are performed, filter unit 312 may store the filtered reconstructed blocks to DPB 314. As discussed above, DPB 314 may provide reference information, such as samples of a current picture for intra-prediction and previously decoded pictures for subsequent motion compensation, to prediction processing unit 304. Moreover, video decoder 300 may output decoded pictures (e.g., decoded video) from DPB 314 for subsequent presentation on a display device, such as display device 118 of FIG. 1.

Quantization is a part of the video coding pipeline. In some examples, quantization is the only step in the coding pipeline where a loss of information occurs. Currently, video coding implementations may make quantization decisions using greedy search methods or heuristics. An initial quantization value is determined using scalar quantization, which may round coefficients by shifting and/or scaling and rounding to the nearest integer value. It is possible to trade off rate (the number of bits needed to transmit the signal) and distortion (the quality loss of the reconstructed signal) by perturbing these quantized values. Given sufficient time, an exhaustive search can find a Pareto front of quantization values that are optimal for some tradeoff parameter lambda. In practice, however, it may not be feasible to perform this search online. This disclosure proposes training a neural network (e.g., neural network 211) and outputting the quantization values produced by the exhaustive search.

Traditional approaches to RDOQ use search algorithms with a high computational complexity. These solutions may not be feasible for real-time video coding on system-on-chip hardware due to frame-rate restrictions and limited area-on-chip. To determine the (e.g., locally) optimal quantization levels of a block of transform coefficients, any search algorithm must try at least several different quantization levels per pixel and select the best one in real-time. The open-source reference implementation of HEVC called HM implements a greedy RDOQ algorithm (see e.g., M. Karczewicz, Y. Yan, I. Chong, "Rate distortion optimized quantization", Video Coding Experts Group (VCEG) of ITU-T SG 16 Q.6}, VCG-AH21, 2008. An approach described in this disclosure uses deep learning to learn search algorithms via neural network 211 such that with a single forward pass of neural network 211, it may be possible to infer the quantization levels for many transform coefficient blocks in parallel. This may allow for accelerated RDOQ inference by leveraging the parallelization capabilities of neural networks, and performance of inference faster than traditional methods. For system-on-chip (SoC) with a dedicated neural processing unit (or AI processor), the implementation of neural network 211 used by video encoder 200 does not require any additional area-on-chip. Neural network 211 may be trained offline in a supervised fashion using a labeled dataset. Neural network 211 may be organized as inputs X and labels Y, where upon seeing the input X, neural network 211 is trained to predict Y. In this disclosure, X contains scaled transform coefficients and the corresponding scalar quantized transform coefficients. To collect labels Y, an RDOQ algorithm may be used to determine the RDOQ quantized transform coefficients, and Y is the difference between the scalar quantized and the RDOQ quantized transform coefficients.

A recent development in chip design is the integration of dedicated components for neural network inference. With neural networks being used in conjunction with or instead of domain-specific algorithms, a neural processing unit (NPU) may eliminate the need for specialized hardware for different domains that are traditionally present on system-on-chips (SoC). For example, an image signal processor (ISP) pipeline that is typically required for high-quality image processing is in the process of being entirely replaced by (or has components that can be replaced by) neural networks (see E. Schwartz, R. Giryes, and A. M. Bronstein, "DeepISP: Toward learning an end-to-end image processing pipeline," IEEE Transactions on Image Processing, vol. 28, no. 2, pp. 912-923, 2018). This is a trend from a hardware design perspective as the specialized ISP hardware reserves a considerable amount of area on the chip. Additionally, resources directed at optimizing the power consumption of the NPU now benefit not only the ISP pipeline, but all other processes that use the NPU.

Similarly, the recent video compression standard H.265, commonly referred to as HEVC (see G. J. Sullivan, J. Ohm, W. Han, and T. Wiegand, "Overview of the high efficiency video coding (HEVC) standard," IEEE Transactions on Circuits and Systems for Video Technology, vol. 22, no. 12, pp. 1649-1668, 2012), may be implemented in specialized hardware. Previous works aim to replace or enhance components of the HEVC standard using deep learning, e.g., intra-frame prediction mode decisions (see T. Laude and J. Ostermann, "Deep learning-based intra prediction mode decision for HEVC," in 2016 Picture Coding Symposium (PCS), IEEE, 2016, pp. 1-5), CU tree split decisions (see M. Xu, T. Li, Z. Wang, X. Deng, R. Yang, and Z. Guan, "Reducing complexity of HEVC: A deep learning approach," IEEE Transactions on Image Processing, vol. 27, no. 10, pp. 5044-5059, 2018), residual prediction (see Z.-T. Zhang, C.-H. Yeh, L.-W. Kang, and M.-H. Lin, "Efficient CTU-based intra frame coding for HEVC based on deep learning," in 2017 Asia-Pacific Signal and Information Processing Association Annual Summit and Conference (APSIPA ASC), IEEE, 2017, pp. 661-664), or even intra-frame rate control (see J.-H. Hu, W.-H. Peng, and C.-H. Chung, "Reinforcement learning for HEVC/H.265 intra-frame rate control," in 2018 IEEE International Symposium on Circuits and Systems (ISCAS), IEEE, 2018, pp. 1-5). Whenever standard compliance is not a requirement, end-to-end learned video compression has been proposed as an alternative video coding pipeline.

Rate-distortion optimized quantization (RDOQ) is a standard-compliant quantization procedure that is known to offer better bit rates than conventional scalar quantization (SQ) (see M. Karczewicz, Y. Ye, and I. Chong, "Rate distortion optimized quantization," ITU-T Q, vol. 6, 2008). RDOQ is a form of adaptive quantization, where the statistics of a block are used to determine its quantization levels. The original RDOQ procedure proposes a brute-force search over all possible quantization levels for all coefficients, e.g., using Viterbi's algorithm. This brute-force search may be computationally expensive and difficult to parallelize. Thus, a brute force search required to find the optimum may be a worst-case scenario.

RDOQ may outperform SQ by trading off bitrate for distortion for some given cost tradeoff parameter $\lambda$. In practice, the procedure sets a new quantization level for each transform coefficient by (e.g., approximately) solving the following discrete optimization problem:

$$q^* = \min_q D + \lambda R \qquad (1)$$

In equation 1, R measures bitrate and $\lambda$ is a Lagrangian coefficient. D measures distortion of a vector of quantized transform coefficients relative to an original vector of scaled transform coefficients.

In another example, the procedure determines a quantization level for each transform coefficient by (e.g., approximately) solving the following discrete problem:

$$q^* = \min_q D(q, x) + \lambda \cdot R(q) \qquad (1')$$

In Equation (1'), D(q,x) is a distortion measure (e.g., mean squared-error) computed between quantization levels q and scaled transform coefficients x, R(q) is the bit-rate associated with encoding q with an entropy coder, and $\lambda \in \mathbb{R}_{>0}$.

These approaches may still be too expensive in a real-time encoding-decoding setup and in the presence of (e.g., hardware-imposed) frame-rate constraints. Additionally, these approaches may be difficult to parallelize. Additionally, a parallelized version may be difficult to implement on hardware and may require reserving additional area on chip for RDOQ circuitry.

A promising solution direction that has the potential to address both concerns is to train a neural network to mimic an expensive RDOQ algorithm (see e.g., T. N. Canh, M. Xu, and B. Jeon, "Rate-distortion optimized quantization: A deep learning approach," in Proc. IEEE High Perform. Extreme Comput. Conf, 2018, pp. 1-4, hereinafter, "Canh"). This approach trades off clock cycles and area on chip with multiply-and-accumulate (MAC) operations and energy consumption. Parallelization may be easy to accomplish (e.g., because most neural network inference hardware is designed to process batches of multiple datapoints, as inference hardware allows passing batches of data as well as single datapoints, etc.). However, Canh uses an expensive Visual Geometry Group (VGG)-based semantic segmentation model, which has roughly 138 million parameters. See J. Long, E. Shelhamer, and T. Darrell, "Fully convolutional networks for semantic segmentation," in Proceedings of the IEEE conference on computer vision and pattern recognition, 2015, pp. 3431-3440.

Figure 5A:
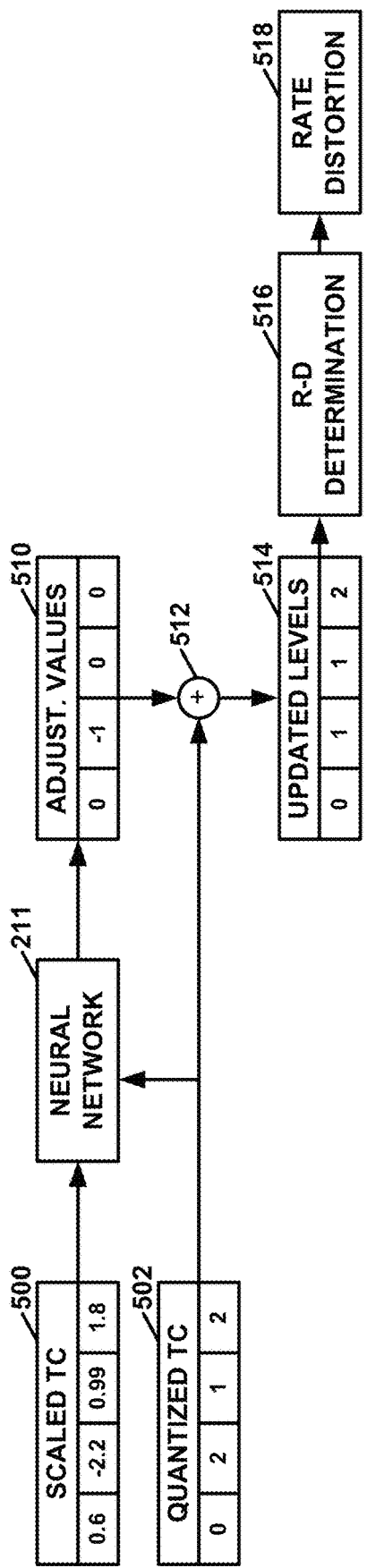
FIG. 5A is a conceptual diagram illustrating an example schematic of a neural network based rate-distortion optimized quantization pipeline.

FIG. 5A shows a schematic of a neural network based RDOQ pipeline. Quantization unit 208 (FIG. 3) may implement the neural network based RDOQ pipeline of FIG. 5A. In the example of FIG. 5A, neural network 211 takes scaled transform coefficients 500 (Scaled TC) and corresponding scalar-quantized quantization levels 502 as inputs and predicts an additive residual per transform coefficient. For example, as shown in the example of FIG. 5A, the pipeline applies (e.g., adds) the network outputs (i.e., adjustment values 510) and scalar quantized quantization levels (Quantized TC) 502 at adder 512 to produce updated quantization levels 514. A rate-distortion (R-D) determination process 516 is applied by video encoder 200 (e.g., HM 16.20 or another encoder) to determine rate-distortion estimates 518. Rate-distortion estimates 518 estimate the effects of replacing the quantization levels 502 with updated quantization levels 514. Video encoder 200 may compute rate-distortion estimates 518 by performing entropy coding, resulting in a bitrate, and by computing peak signal to noise ratio of the original input video and the encoded video.

Figure 5B:
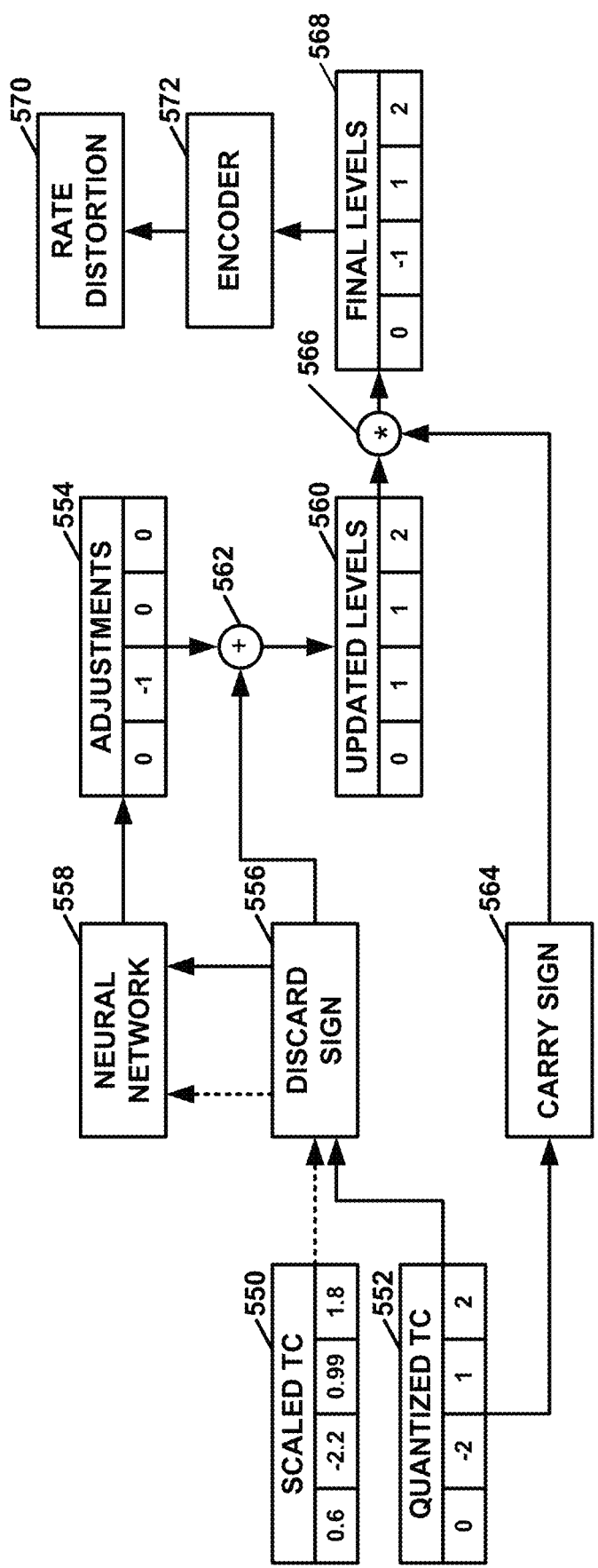
FIG. 5B is a conceptual diagram illustrating an example schematic of a neural network based rate-distortion optimized quantization pipeline where the sign of each transform coefficient is ignored during neural network inference.

FIG. 5B is an alternative example schematic of a neural network based RDOQ pipeline in accordance with one or more techniques of this disclosure. More specifically, FIG. 5B is a conceptual diagram illustrating an example schematic of a neural network based RDOQ pipeline where the sign of each transform coefficient is ignored during neural network inference. In the example of FIG. 5B, the neural network model takes absolute-valued scaled transform coefficients (Scaled TC) (550) and quantized transform coefficients (Quantized TC) (552) as input. Additionally, video encoder 200 predicts an additive adjustment value (554) for each transform coefficient. To predict the additive adjustment value for a transform coefficient, video encoder 200 may discard a sign of the transform coefficient (556). In other words, video encoder 200 may determine an absolute value of the transform coefficient. Video encoder 200 may then apply a neural network (558) to determine a predicted additive adjustment value (554) for the transform coefficient. In the example of FIG. 5B, the possible set of adjustment values are {−1, 0}. To obtain the final quantized transform coefficients (updated quantization levels) (560), video encoder 200 adds (562) adjustments (554) to the absolute-valued quantized transform coefficients. Video encoder 200 inserts the sign (564) back through multiplication (566), thereby determining final quantization levels (568). Video encoder 200 may then obtain rate-distortion estimates (570) of the final quantized quantization levels using, e.g., as described above with respect to FIG. 5A (572).

This disclosure expands on the work of Canh and makes at least the following contributions:
1) Two neural architectures for RDOQ: a fully convolutional neural network and an autoregressive network. Both architectures have substantially fewer parameters than the work of Canh, which makes the architectures likely to be both faster to execute and more memory-efficient;
2) A method for scaling the cross-entropy loss per transform coefficient according to its empirical effect on rate-distortion of the entire block;
3) A method to obtain high-quality training labels for training neural networks to imitate expensive RDOQ algorithms;
4) A method to bound increasing rate due to misclassifications on transform coefficients whose corresponding scalar quantized quantization levels are 0.

In accordance with one or more techniques of this disclosure, a computing system (e.g., one or more of source device 102, destination device 116, or one or more other devices) trains a neural network to determine the quantization level for each transform coefficient in a given block, e.g., as displayed in FIG. 5A and FIG. 5B. The computing system may gather high-quality training labels using a heuristic search. The computing system may then use these training labels as training targets. Thus, in some examples, the network is trained to imitate RDOQ/brute-force residuals.

In some examples, the computing system may train two types of neural networks on this data, namely fully convolutional neural networks (CNNs) and autoregressive models (ARMs). These neural networks may be integrated into a codec (e.g., HM or another codec implementation) as an alternative to conventional RDOQ.

Frame-rate restrictions on hardware implementations of video encoders may prohibit implementations of a conventional RDOQ algorithm on hardware. As previously mentioned, such an implementation would require reserving additional area on chip for RDOQ circuitry. These obstacles can be overcome using a deep learning approach, where clock cycles and area on chip can be traded-off with multiply-and-accumulate (MAC) operations and energy consumption.

Let x be a block of scaled transform coefficients of size N×N, wherein the block size N∈{4, 8, 16, 32} corresponds to the block dimensions permitted under HEVC. Let $f_{RDOQ}$ be an RDOQ algorithm that maps the block x to N×N quantization levels $q_{RDOQ}$. Additionally, let $q_{SQ}$ be the quantized quantization levels obtained using a method of scalar quantization.

Similar to Canh, a computing system may train a network to imitate $f_{RDOQ}$ by outputting how each element of $q_{SQ}$ should be adjusted to resemble $q_{RDOQ}$. That is, given an input tuple of unquantized scalar transform coefficients and its corresponding scalar quantized coefficients (x, $q_{SQ}$), the network predicts Δ such that $\Delta + q_{SQ} = f_{RDOQ}(x)$. In this way, the network performs refinement by transforming a content-agnostic quantization to an improved content-aware quantization. In other words, given an existing quantization vector $q_{SQ}$, return a vector Δ such that $\hat{q} := q_{SQ} + \Delta$.

In some examples, the computing system trains the network to imitate $f_{RDOQ}$ by outputting how each element of $q_{SQ}$ should be refined. In particular, the computing system trains the network to output an adjustment value Δ, given unquantized transform coefficients x:

$$\Delta + q_{SQ} = \hat{q} \approx q_{RDOQ}$$

In this way, the network performs refinement by transforming a content-agnositic quantization $q_{SQ}$ to an improved content-aware quantization q̂. In some examples, only the network is used to predict the residual quantization levels and a search may be skipped. Network decisions may be applied before the sign bit hiding step of the video coding pipeline.

As the performance of the network is bounded by the quality of the labels, this disclosure proposes to spend additional offline time to further refine labels provided by RDOQ. The computing system uses a tree search method. First, unquantized coefficients x are scaled so that the unquantized coefficients lie in the range [0; 8]. For each unquantized scaled coefficient, one or more quantization options are available, for example rounding up or down. One example method includes a local greedy search that exhaustively searches for the lowest cost for each 4×4 coefficient group, for a given order of coefficients, for example a raster scan order. In this context, cost refers to the joint rate-distortion objective (as stated in equation 1). This process may be repeated $n_{passes}$ times. Another example is a heuristic search based on the A* algorithm. The resulting quantization levels are returned and saved for network training.

A computing system trains a neural network f on the generated data using supervised learning. For instance, the computing system may train neural network f on data (X, Δ) generated by an RDOQ solution. The last layer of the network will have N×N×k outputs, where k is the number of possible quantization values. The output of the network may correspond to unnormalized log-probability for each of the adjustment values. The computing system trains the network to maximize the probability of selecting the quantization value given by the data, or, equivalently, to minimize the negative log-likelihood of the data for all quantized coefficients $q_i \in q$:

$$\mathcal{L} = -E_{x \sim P(x)}[\Sigma_{i=1}^{N^2} \log f(q_i|X)] \quad (2)$$

In some examples, the computing system trains the network to maximize the probability of selecting the quantization value given by the data, or, equivalently, to minimize the negative log-likelihood of the data for all quantized coefficients $q_i \in q$:

$$\mathcal{L} = -E_{x \sim p(x)}[\Sigma_{i-1}^{N^2} \Sigma_{k=1}^{k} \log f(q_i,k|x)]$$

Minibatch gradient descent is used in order to avoid the (infeasible) marginalization over the data distribution.

Training a network based on examples of expert trajectories is typically referred to as imitation learning (see e.g., S. Schaal, "Is imitation learning the route to humanoid robots?" Trends in cognitive sciences, vol. 3, no. 6, pp. 233-242, 1999) (or more specifically, behavioral cloning). In practice, the performance of the network f is bounded by that of the expert ($f_{FROQ}$). That is, the trained network will only be as good as the training labels that are provided. In this task, it may be computationally prohibitive to obtain and provide the best labels (quantization levels) for our data. However, it is possible to improve the quality of training labels through an offline search method. At test time, only the network is used to predict the residual quantization levels and the search is skipped.

The sign of the input variable may be discarded during the forward-pass of the neural networks, e.g., as shown in (556) of FIG. 5B. Video encoder 200 inserts the sign after adding the adjustment values. Because the sign is irrelevant for quantization decisions, discarding the sign may simplify the optimization problem and may make networks (e.g., neural network 558) easier to train. All inputs to the network (e.g., neural network 558) may be standardized to be distributed according to a standard normal distribution by subtracting an empirical mean and scaling by an empirical standard deviation which may be obtained from the training dataset. Because the input data statistics may vary significantly between different QPs and prediction structures, separate models may be trained for each pair of QP and prediction structures.

In some examples, a computing system trains two types of neural network: a feedforward network and/or an autoregressive network. Furthermore, in some examples, to simplify the learning task, the training targets may be set to be the difference between the scalar-quantized coefficients $q_{SQ}$ and the training targets $q_{RDOQ}$ and clip Δ so that all training targets are in a finite set. Furthermore, in some examples, adjustment values may be restricted to a subset of possible adjustment values using clipping. For example, to restrict adjustment values to the set {−1,0; 1}, the following equation can be used:

$$\Delta = \min(\max(q_{RDOQ} - q_{SQ}, -1), 1) \quad (3)$$

The training set may consist of tuples of the form (X; Y) where X:=(x; $q_{SQ}$) or a transformation of them, and Y:=Δ and the inference procedure is depicted in FIG. 5A and FIG. 5B. To reduce the number of possible training targets, values smaller than −1 and larger than +1 are removed. In other examples, the training targets are in {−1, 0}.

The computing system may train two types of neural architecture: feedforward fully convolutional models (FCNs) and autoregressive models (ARMs). Feedforward models are fast, as they only require a single inference pass to obtain predictions for all coefficients q̂. Autoregressive models instead make predictions one-by-one, which may make them slower than FCNs, but allow modeling of data with high complexity. The inference procedure for both types of network is depicted in FIG. 5B.

Fully convolutional neural network: In some examples, a fully convolutional neural network $f_{FCN}$, whose inputs may include scaled transform coefficients x (e.g., unquantized coefficients) and the scalar-quantized quantization levels $q_{SQ}$ (e.g., scalar-quantized baseline quantization levels) or some transformation of these, outputs the probabilities of all k possible adjustment values (e.g., 2, 3 possible adjustment values) for each of the transform coefficients simultaneously.

$$\text{Log } P(\Delta|q, q_{SQ}) \propto f_{FCN}(x, q_{SQ}) \quad (4)$$

This approach is similar to T. N. Canh, M. Xu, and B. Jeon, "Rate-distortion optimized quantization: A deep learning approach," in Proc. IEEE High Perform. Extreme Comput. Conf, 2018, pp. 1-4, who use a fully convolutional architecture as well. An advantage of this method over RDOQ is that a search is no longer needed, and adjustment values are obtained using a single neural network forward call that is easily performed on the already-present specialized hardware on a chip.

Autoregressive network: A potential disadvantage to using a feedforward network, such as a fully convolutional network, is that the joint decision the feedforward network makes for all coefficients simultaneously may limit the quality of the prediction. A reason for this is that the optimal decision for a single transform coefficient likely depends on the decisions at all other transform coefficients. Additionally, it is likely that some decisions are more important than others for the final cost, as the distribution of quantized values differs per location in the block. For this reason, this disclosure explores autoregressive neural networks, which condition their output at transform coefficient I on all previous coefficients for some given coefficient order (e.g., raster scan order):

$$P(\Delta|q,q_{SQ},\Delta_{<i}) \propto \mathrm{ARM}(q,q_{SQ},\Delta_{<i}) \qquad (5)$$

Similar to the feedforward case, the joint negative log likelihood is minimized, which can be expressed as the product of conditionals:

$$\log P(\Delta|q,q_{SQ}) = \Sigma_{i=1}^{N^2} \log P(\Delta_i|q,q_{SQ},\Delta_{<i}) \qquad (6)$$

Here, the conditioning for the first coefficient at i=1 is equal to $\Delta_{<i}=\emptyset$. In another example, the joint negative log likelihood may be expressed as a product of conditionals:

$$\log P(\Delta|x,q_{SQ}) = \Sigma_{i=1}^{N^2} \log P(\Delta_i|x,q_{SQ},\Delta_{<i}) \qquad (6')$$

In equation (6'), the first coefficient i=1 is based on only the raw transform coefficient equal to $\Delta_{<i}=\emptyset$.

Autoregressive neural networks are designed in such a way that inference is parallelized (see Y. Bengio and S. Bengio, "Modeling high-dimensional discrete data with multi-layer neural networks," in Advances in Neural Information Processing Systems, 2000, pp. 400-406 and H. Larochelle and I. Murray, "The neural autoregressive distribution estimator," in Proceedings of the Fourteenth International Conference on Artificial Intelligence and Statistics, 2011, pp. 29-37), which enables efficient training using a scheme known as teacher forcing. Instead of predicting the output values one by one and filling in previous predictions $\hat{q}_{>i}$, the ground truth is given as conditioning. In other words, instead of predicting one by one (i.e., using prediction $\hat{q}_{i+1}$ for all i), the ground truth $\Delta_{<i}$ is given to the ARM for all time steps to produce predictions $\hat{q}$ in parallel. As a result, video encoder 200 only queries the network (e.g., neural network 558) once during training.

However, at test time when no ground truth is available, the number of network queries needed to obtain a full prediction q may be equal to the dimensionality of the block: $N^2$. This may make an autoregressive neural network a less appealing choice than a feedforward network when runtime efficiency is the main consideration. Recent works mitigate this problem by exploiting that conditional probabilities may not depend on all previous outputs (see, e.g., A. J. Wiggers and E. Hoogeboom, "Predictive Sampling with Forecasting Autoregressive Models," arXiv preprint arXiv:2002.09928, 2020). The techniques of this disclosure may utilize this approach as well, as this approach allows exploiting the data imbalance in order to potentially reduce sampling time.

As mentioned elsewhere in this disclosure, this disclosure explores two neural network architectures for our experiments, a fully convolutional neural network (FCN) and an autoregressive model (ARM) with global conditioning. In different examples, the number of layers, kernel size (for FCN), number of hidden units/channels per layer, activation function, learning rate, the use of BatchNorm (see e.g., S. Ioffe and C. Szegedy, "Batch normalization: Accelerating deep network training by reducing internal covariate shift," in Proceedings of the 32nd International Conference on International Conference on Machine Learning—Volume 37, ser. ICML'15. JMLR.org, 2015, p. 448-456) and Dropout (see e.g., N. Srivastava, G. Hinton, A. Krizhevsky, I. Sutskever, and R. Salakhutdinov, "Dropout: A simple way to prevent neural networks from overfitting," J. Mach. Learn. Res., vol. 15, no. 1, p. 1929-1958, January 2014), and various other aspects may be varied.

The FCN architecture may include (or consist of) a number of 2D convolutional layers with a fixed kernel size and channel depth. Each layer may be followed by a dropout layer with a pre-determined dropout probability p or a BatchNorm layer and a ReLU non-linearity. Zero-padding may be applied where necessary to ensure that the output height and width dimensions of each layer remain constant. The last convolution layer may perform 1×1 convolutions and may have a channel depth equal to k, the number of possible adjustment values. In some examples, the channel depth is equal to 3 to output the logits for each prediction class (in order −1, 0, and +1). In other examples, the channel depth is equal to 2 or another value.

Figure 6A:
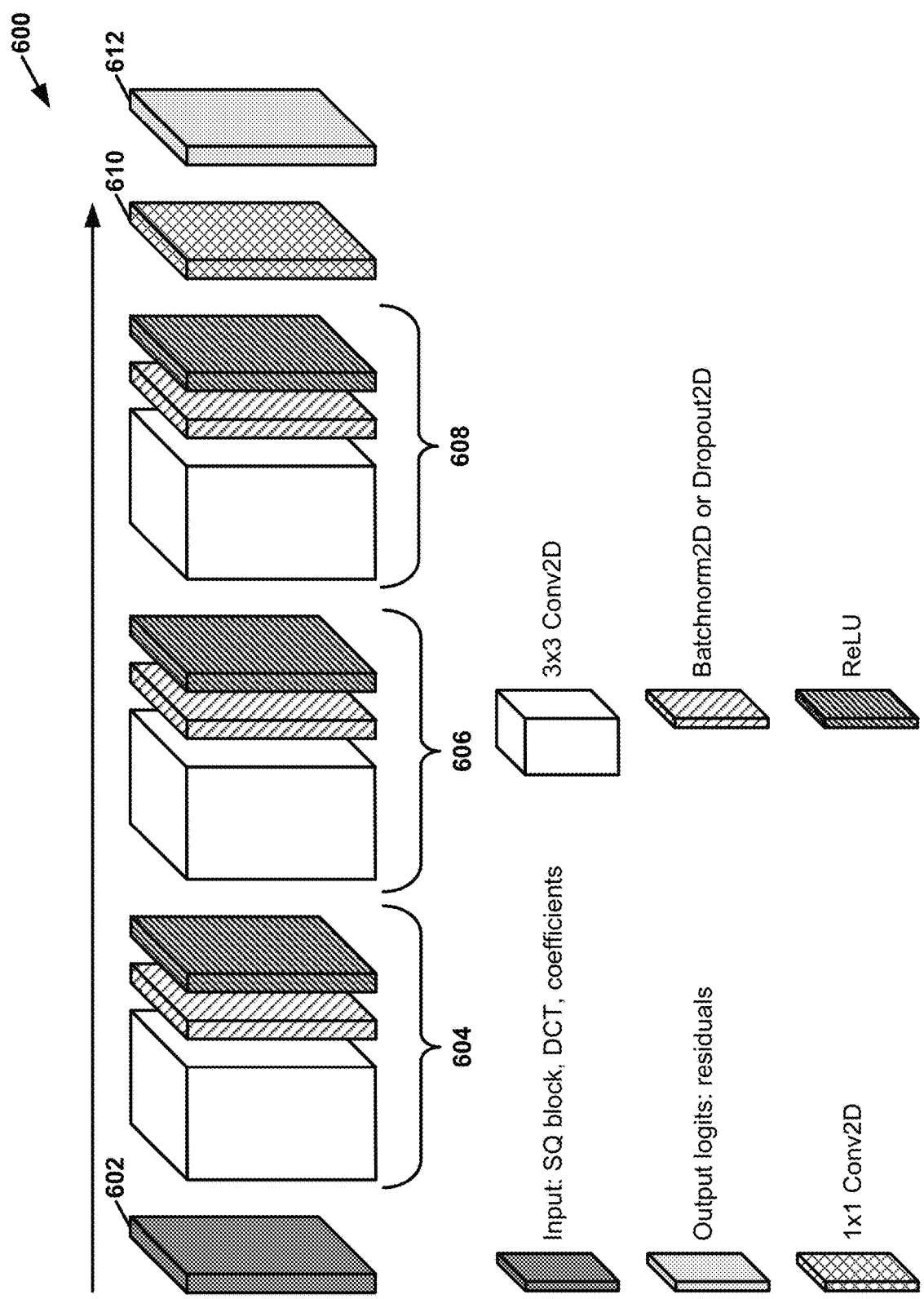
FIG. 6A is a conceptual diagram illustrating an example fully-convolutional neural network in accordance with one or more techniques of this disclosure.

FIG. 6A is an example fully convolutional network 600 in accordance with one or more techniques of this disclosure. As shown in the example of FIG. 6A, input data 602 provided to network 600 may include a square block of DCT coefficients. In some examples, input data 602 includes scaled transform coefficients and quantized transform coefficients. Network 600 includes a first layer set 604, a second layer set 606, and a third layer set 608. Each of layer sets 604, 606, 608 includes a convolutional network in which neurons have 2-dimensional 3×3 receptive fields (i.e., 3×3 Conv2D). Output of the convolutional network is processed by a 2-dimensional batch norm layer (Batchnorm2D) or a 2-dimensional dropout layer (Dropout2D). Output of the batchnorm2D layer or dropout2D layer is processed by a rectified linear unit (ReLU) layer. Output of layer set 608 is provided to a convolutional layer 610 in which each neuron has a 2-dimensional 1×1 receptive field (i.e., 1×1 Conv2D). Network 600 also includes an output layer 612 that receives the output of convolutional layer 610. In the example of FIG. 6A, output layer 612 applies a logit function to the output of convolutional layer 610 to generate probabilities values (e.g., log-odds) of potential adjustment values (which may in this context be referred to as residuals).

Figure 6B:
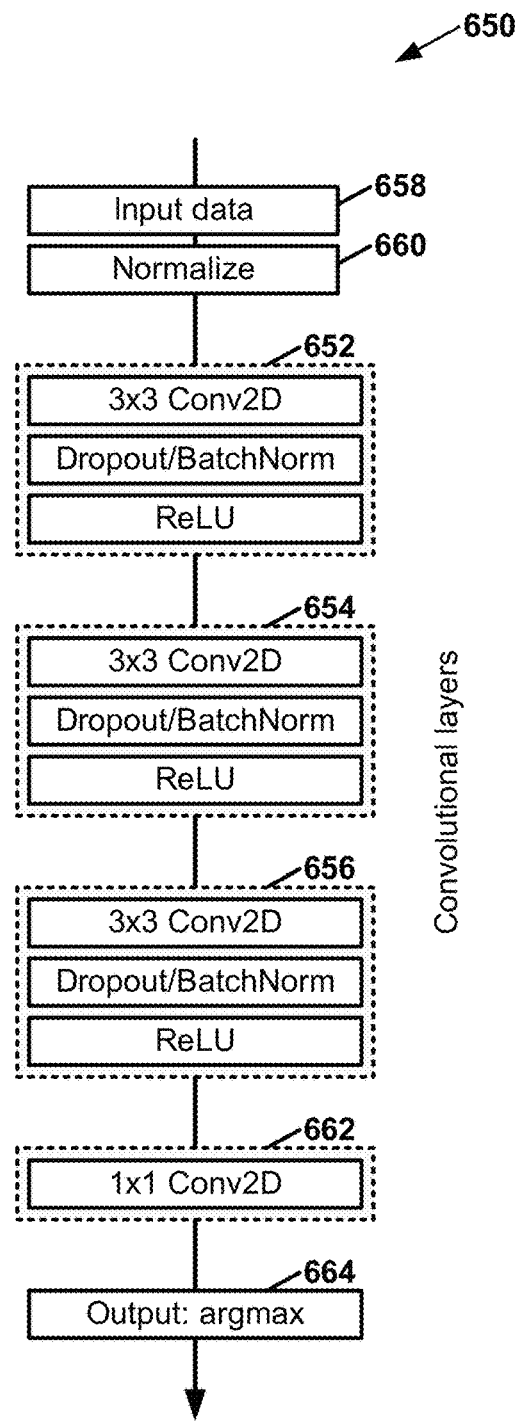
FIG. 6B is a conceptual diagram illustrating an example fully-convolutional neural network in accordance with one or more techniques of this disclosure.

FIG. 6B is another example fully convolutional network 650 in accordance with one or more techniques of this disclosure. In the example of FIG. 6B, network 650 includes layer sets 652, 654, and 656. Similar to layer sets 604, 606, and 608 (FIG. 6A), each of layer sets 652, 654, and 656 includes a 3×3 Conv2D network, a batchnorm2D or dropout2D layer, and a ReLU layer. In the example of FIG. 6B, network 650 receives input data 658. Input data 658 may include scaled transform coefficients and quantized transform coefficients. Furthermore, network 650 includes a normalization layer 660 that standardizes input data 658, e.g., by subtracting the empirical mean of the dataset and dividing by the empirical standard deviation. Layer set 652 receives the normalized input data.

Network 650 also includes a convolutional layer 662 in which each neuron has a 2-dimensional 1×1 receptive field (i.e., 1×1 Conv2D). Convolutional layer 662 processes output of layer set 656. Network 600 includes an output layer 664 that applies an argmax function to output of convolutional layer 662, thereby generating output of network 650.

Figure 7A:
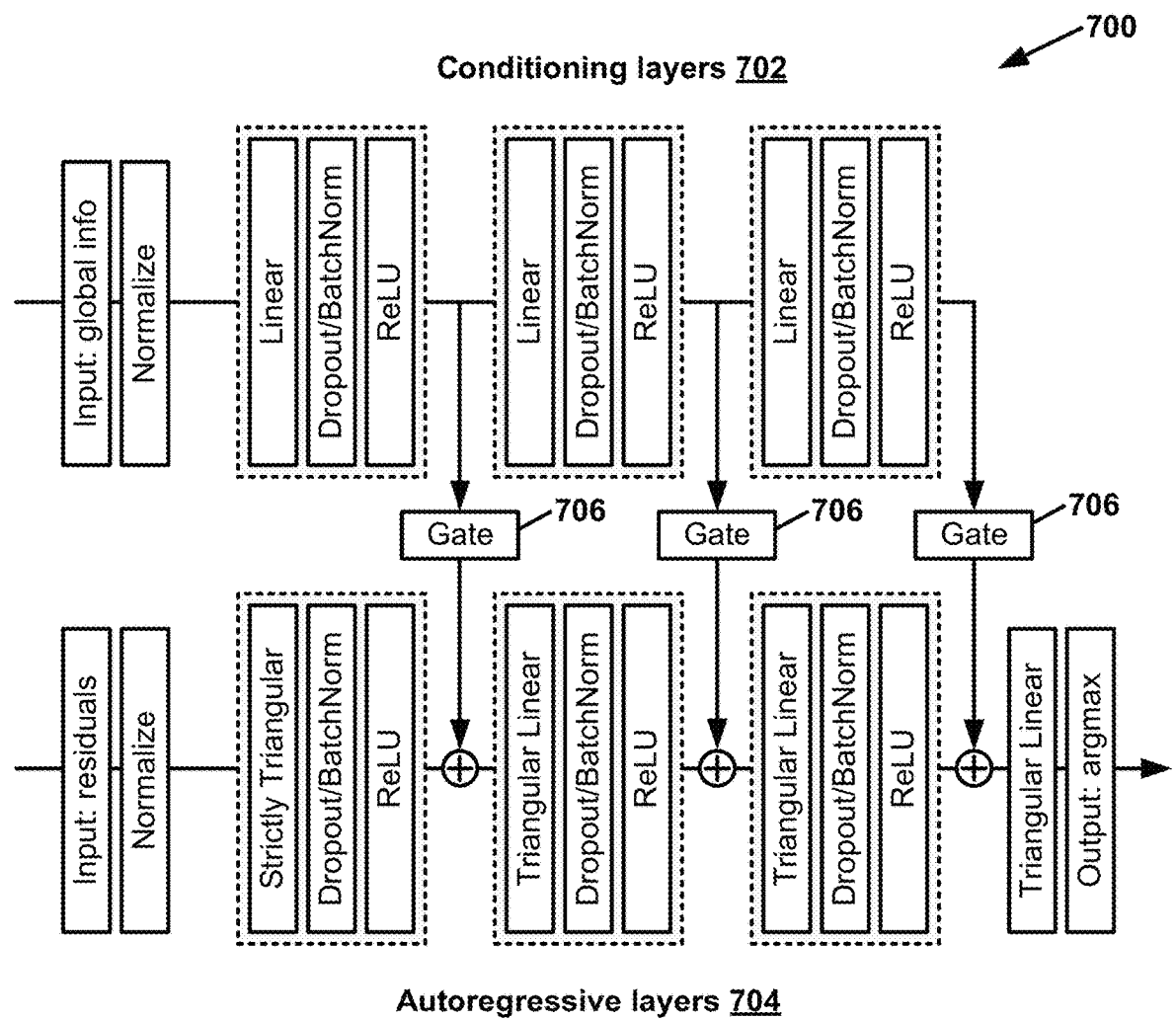
FIG. 7A is a conceptual diagram illustrating an example schematic of an autoregressive model (ARM) architecture with conditioning layers in accordance with one or more techniques of this disclosure.

FIG. 7A is a conceptual diagram illustrating an example schematic of an autoregressive model (ARM) architecture 700 with conditioning layers in accordance with one or more techniques of this disclosure. In the example of FIG. 7A, ARM architecture 700 includes (or consists of) two tracks: conditioning layers 702 and autoregressive layers 704. Conditioning layers 702 and autoregressive layers 704 are connected by gated fully connected layers 706. Autoregressive layers 704 take, as input, the one-hot encoded adjustments Δ, where the one-hot encoded adjustment vector contains the number 1 in a vector element corresponding to the adjustment decision of RDOQ as recorded in the dataset and the number 0 for all other elements in the vector, whereas conditioning layers 702 take the same input as the convolutional neural network (CNN). Each strictly triangular layer is a linear layer that masks the weights in such a way that the autoregressive structure is preserved: the i'th output channel only depends on inputs $\Delta_{<i}$. This imposes an order on the coefficients. In some examples, a raster scan order is used. However, in other examples, any scan order can be used. Each of gate layers 706 may include (or consist of) a fully connected layer that outputs 2n channels. The first n channels are passed through a sigmoid, and the result is multiplied with the second n channels.

As noted above, FIG. 7A is a schematic of the ARM with conditioning layers 702. A first ARM layer may use causal connections via a strictly triangular weight layer ensuring that the temporal dependence of successive residuals is not violated. Each ARM layer may receive global information about the block (e.g., scalar quantized quantization levels and scaled transform coefficients) via a corresponding hidden layer from the conditioning network. Each ARM layer and/or conditioning layer may be succeeded by a dropout layer with a pre-determined dropout probability p or a BatchNorm layer and a ReLU non-linearity.

Figure 7B:
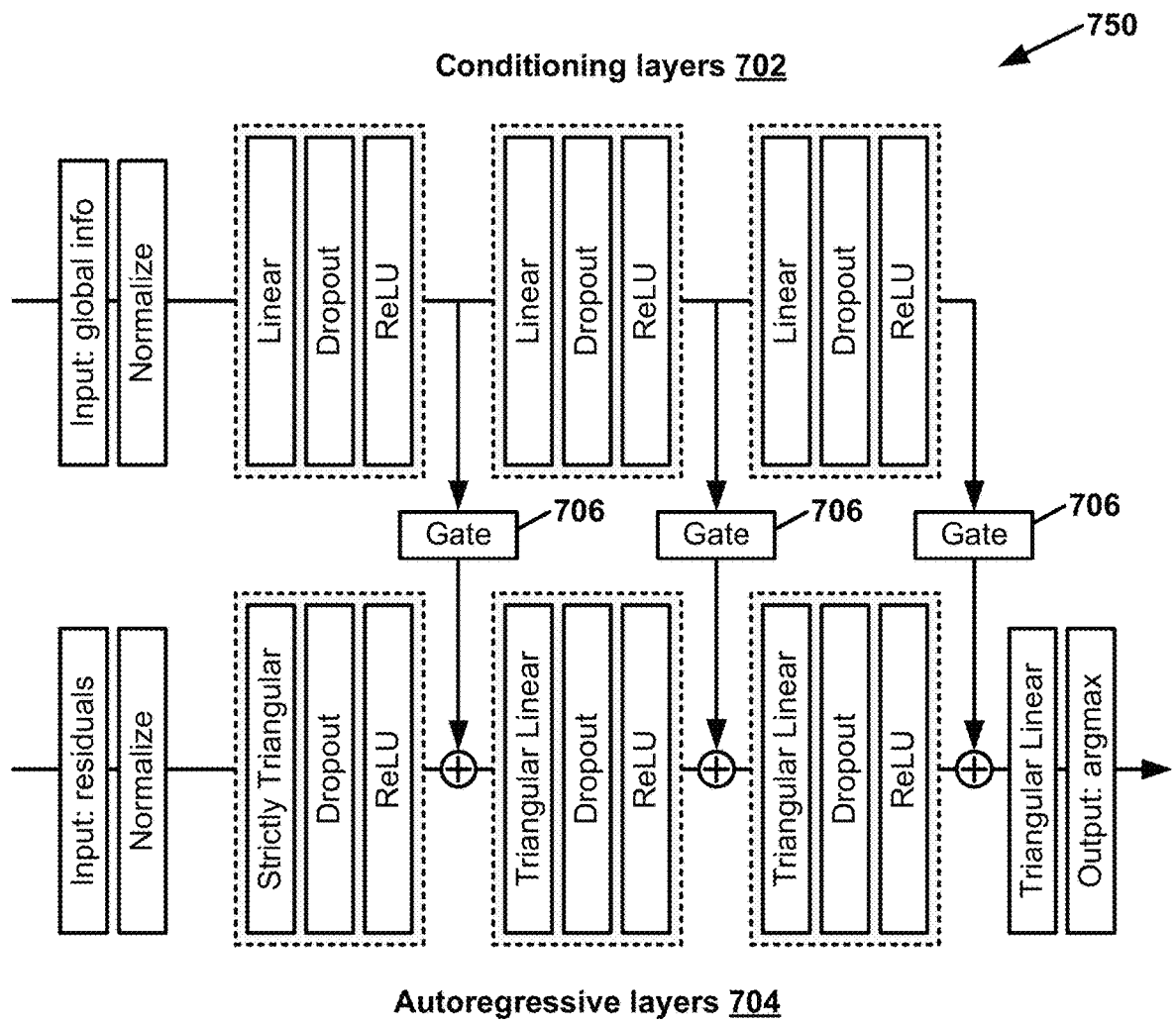
FIG. 7B is a conceptual diagram illustrating another example schematic of an ARM architecture with conditioning layers in accordance with one or more techniques of this disclosure.

Another example ARM architecture 750 is shown in FIG. 7B. ARM architecture 750 is similar to ARM architecture 700 (FIG. 7A), except that the second layers of each layer set use dropout and not batchnorm.

In addition to varying the architecture and hyperparameters of the neural networks (e.g., neural network 558) during training, several variations to the training methods may be used to potentially obtain stronger performance.

Different input transformations and input types may be considered. Examples include scalar quantized transform coefficients with and without an offset. For scalar quantized transform coefficients with offset, video encoder 200 may use the scalar quantization of HM16.20 with offset (i.e., HM-SQ). The scaled transform coefficient inputs may be varied inputs as well, where instead of the scaled transform coefficients obtained from HM16.20, the offset between the scaled transform coefficients and the quantized transform coefficients may be used, which is equal to the information lost due to quantization.

Adjustment Values: The number of output classes k determines the set of adjustment values. Because a goal of this disclosure is to decrease the rate of bits per picture, any such set should at a minimum contain {−1, 0}. Setting k=2 limits the possible set of decisions that can be made by the model (e.g., neural network 558). However, the adjustment value distribution may be highly peaked at 0, and the convenience of training for binary classification may outweigh the limited decision capacity of the model.

Loss Scaling: It may not be possible to use stochastic gradient descent to train the network (e.g., neural network 558) to optimize rate-distortion directly when video encoder 200 uses HM16.20 to obtain accurate rate estimates. This limitation may be an obstacle to training powerful models because the cross-entropy loss may not always be a suitable proxy for rate-distortion. This is due to the fact that cross-entropy penalizes all classification errors equally across classes and transform coefficients. However, this symmetry does not exist in the rate-distortion functions used in video coding. Mistakenly outputting a Δ of 0 instead of a Δ of −1 will have a different effect on the cost than the inverse misclassification (i.e., a Δ of −1 instead of a Δ of 0). Similarly, making a classification error in the top-left transform coefficient in a block (i.e., the DC transform coefficient) does not have the same effect on rate-distortion as making the same mistake in another transform coefficient. However, using cross-entropy as a loss function when training the network may penalize these classification errors equally.

In order to alleviate this limitation, a rate-distortion sensitivity map may be computed that scales the cross-entropy loss at each transform coefficient according to its empirical effect on rate-distortion relative to other transform coefficients. Use of the rate-distortion sensitivity map may put more emphasis on transform coefficients that have larger influence on the rate-distortion of a block. The map is computed by taking the sum of the absolute value of the change in rate-distortion caused by a unilateral shift of a quantized transform coefficient (e.g. by −1 or +1) across the training set, and divided by the sum of these values over all transform coefficients in order to sum to 1. During training, the cross-entropy value at each transform coefficient may be multiplied by the respective scalar value in the map.

Thus, in some examples, as part of training the neural network, a device (e.g., source device 102 or another device) may determine a cross-entropy loss of output of the neural network (e.g., the determined quantization level for a particular transform coefficient). The device may then scale the cross-entropy loss of the neural network based on a rate-distortion sensitivity map. The device may train the neural network based on the scaled cross-entropy loss. For instance, the device may use the scaled cross-entropy loss for performing a backpropagation algorithm to update parameters of the neural network.

As previously mentioned, the adjustment value distribution may be heavily skewed. To facilitate training, class-balancing may be used to increase the weight of less-frequent classes with respect to the dominant class 0. The values used for class balancing may be determined by a grid search.

Zero Masking: To limit any potential increase in rate by predictions of the neural network (e.g., neural network 558), during training and/or inference, adjustments on transform coefficients whose HM-SQ level is zero may be discarded. This may be done by overwriting the output of the network for transform coefficients for which the HM-SQ level is zero so that the probability of an adjustment value of zero is the maximum probability. The increase in rate by changing 0→+/−1 may be too high a cost for any potential reduction in distortion induced by that change.

In various examples, video encoder 200 may use networks (e.g., neural network 558) that have a different number of layers, kernel sizes (for FCN), activation functions, learning rates, and/or other characteristics. In some examples, during training, a computing system may use BatchNorm (see S. Ioffe and C. Szegedy, "Batch normalization: Accelerating deep network training by reducing internal covariate shift," in Proceedings of the 32nd International Conference on International Conference on Machine Learning—Volume 37, ser. ICML'15. JMLR.org, 2015, p. 448-456) or Dropout (see N. Srivastava, G. Hinton, A. Krizhevsky, I. Sutskever, and R. Salakhutdinov, "Dropout: A simple way to prevent neural networks from overfitting," J. Mach. Learn. Res., vol. 15, no. 1, p. 1929-1958, January 2014). Additionally, a rate-distortion sensitivity map, and class balancing may be varied.

In both the FCN and ARM, the input to the network (e.g., neural network 558) is the same and is described as follows. The networks operate at the level of each block b. The inputs to the networks are quantization levels $q_{SQ}$ for b and scalar transform coefficients. The quantization levels $q_{SQ}$ may be determined based on scalar quantization and, in some examples, based on other additional transformations (e.g., absolute value transform) of the transform coefficients of block b. The scalar transform coefficients may be determined by applying scalar quantization to the scaled transform coefficients and, in some examples, by applying other additional transformations (e.g., absolute value transform) of the scaled transform coefficients.

Figure 8:
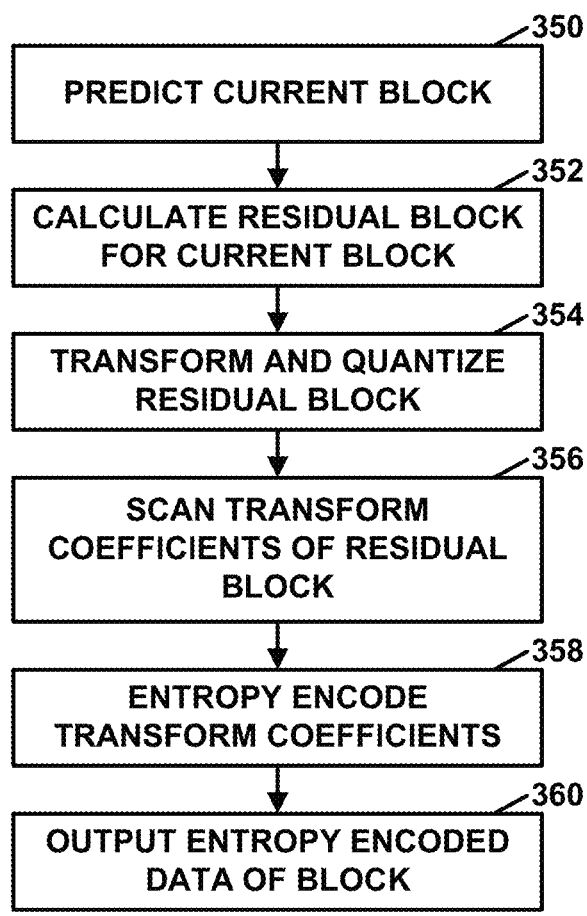
FIG. 8 is a flowchart illustrating an example method for encoding a current block.

FIG. 8 is a flowchart illustrating an example method for encoding a current block. The current block may comprise a current CU. Although described with respect to video encoder 200 (FIGS. 1 and 3), it should be understood that other devices may be configured to perform a method similar to that of FIG. 8.

In this example, video encoder 200 initially predicts the current block (350). For example, video encoder 200 may form a prediction block for the current block. Video encoder 200 (e.g., residual generation unit 204 of video encoder 200) may then calculate a residual block for the current block (352). To calculate the residual block, video encoder 200 may calculate a difference between the original, unencoded block and the prediction block for the current block. Video encoder 200 may then transform the residual block and quantize transform coefficients of the residual block (354). For instance, in the context of FIG. 3, transform processing unit 206 may transform the residual block and quantization unit 208 may quantize the resulting transform coefficients. In accordance with one or more techniques of this disclosure, video encoder 200 (e.g., quantization unit 208 of quantization unit 208 of video encoder 200) may perform RDOQ using deep learning techniques of this disclosure as part of quantizing the transform coefficients.

Next, in the example of FIG. 8, video encoder 200 may scan the quantized transform coefficients of the residual block (356). During the scan, or following the scan, video encoder 200 (e.g., entropy encoding unit 220 of video encoder 200) may entropy encode the transform coefficients (358). For example, video encoder 200 may encode the transform coefficients using CAVLC or CABAC. Video encoder 200 may then output the entropy encoded data of the block, e.g., in a bitstream (360).

Figure 9:
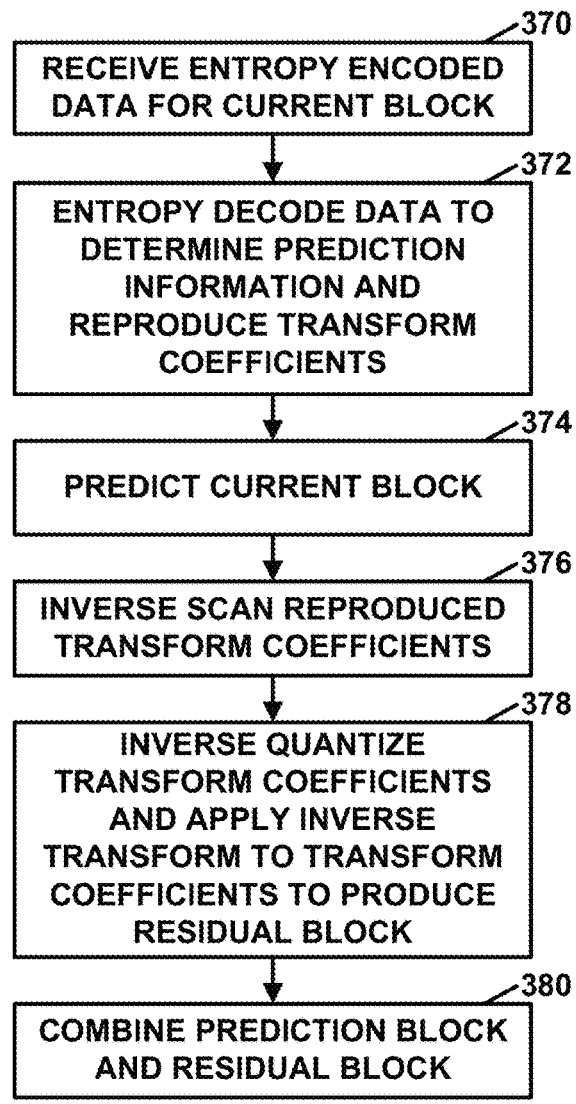
FIG. 9 is a flowchart illustrating an example method for decoding a current block of video data.

FIG. 9 is a flowchart illustrating an example method for decoding a current block of video data. The current block may comprise a current CU. Although described with respect to video decoder 300 (FIGS. 1 and 4), it should be understood that other devices may be configured to perform a method similar to that of FIG. 9.

Video decoder 300 may receive entropy encoded data for the current block, such as entropy encoded prediction information and entropy encoded data for transform coefficients of a residual block corresponding to the current block (370). Video decoder 300 (e.g., entropy decoding unit 302 of video decoder 300) may entropy decode the entropy encoded data to determine prediction information for the current block and to reproduce transform coefficients of the residual block (372). Video decoder 300 may predict the current block (374), e.g., using an intra- or inter-prediction mode as indicated by the prediction information for the current block, to calculate a prediction block for the current block. In the context of FIG. 4, prediction processing unit 304 of video decoder 300 may predict the current block (i.e., generate a prediction block for the current block). Video decoder 300 may then inverse scan the reproduced transform coefficients (376), to create a block of quantized transform coefficients. Video decoder 300 may then inverse quantize the transform coefficients and apply an inverse transform to the transform coefficients to produce a residual block (378). For instance, in the context of FIG. 4, inverse quantization unit 306 may inverse quantize the transform coefficients and inverse transform processing unit 308 may apply the inverse transform to the transform coefficients. The transform coefficients may have been quantized using an RDOQ process in accordance with one or more techniques of this disclosure. Video decoder 300 may ultimately decode the current block by combining the prediction block and the residual block (380).

Figure 10:
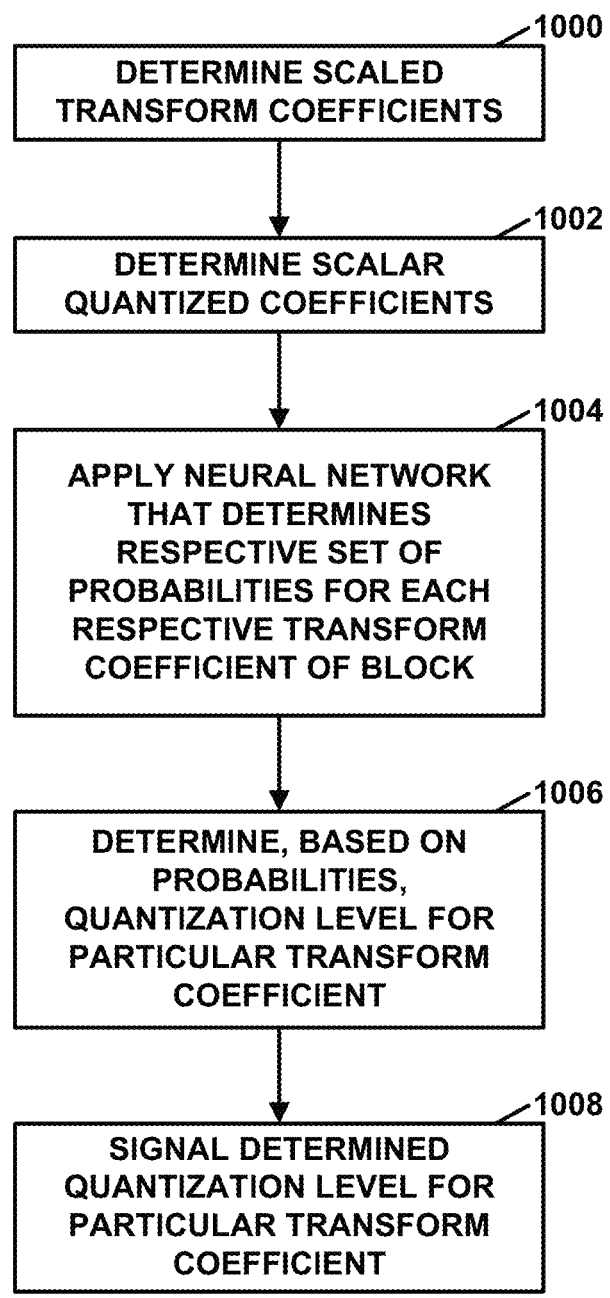
FIG. 10 is a flowchart illustrating an example method of encoding video data in accordance with one or more techniques of this disclosure.

FIG. 10 is a flowchart illustrating an example method of encoding video data in accordance with one or more techniques of this disclosure. Although described with respect to video encoder 200 (FIGS. 1 and 3), it should be understood that other devices may be configured to perform a method similar to that of FIG. 10.

In the example of FIG. 10, quantization unit 208 determines scaled transform coefficients (1000). To determine the scaled transform coefficients, quantization unit 208 may scale transform coefficients of a block of the video data according to a given quantization step.

Additionally, in the example of FIG. 10, quantization unit 208 may determine scalar quantized coefficients (1002). To determine the scalar quantized coefficients, quantization unit 208 may apply scalar quantization to the scaled transform coefficients of the block. For instance, quantization unit 208 may determine the scaled transform using the formula $$q := \left\lfloor \frac{x}{s} + \epsilon \right\rfloor,$$

where x is a scaled transform coefficient, s is a step size and E is a quantization offset parameter. In other words, to determine the scalar quantized coefficients, quantization unit 208 may, for each scaled transform coefficient of the scaled transform coefficients, determine a scalar quantized coefficient corresponding to the scaled transform coefficient as being equal to an output of a floor function of a first value. The first value is equal to a second value plus a quantization offset parameter. The second value is equal to the scaled transform coefficient divided by a step size.

In other examples, no quantization offset parameter is used. Thus, in such examples, to determine the scalar quantized coefficients, quantization unit 208 may, for each scaled transform coefficient of the scaled transform coefficients, determine a scalar quantized coefficient corresponding to the scaled transform coefficient as being equal to an output of a floor function of a first value, wherein the first value is equal to the scaled transform coefficient divided by a step size.

Furthermore, in the example of FIG. 10, quantization unit 208 applies neural network 211 to determine a respective set of probabilities for each respective transform coefficient of the block (1004). The respective set of probabilities for the respective transform coefficient includes a respective probability value for each possible adjustment value in a plurality of possible adjustment values. In some examples, the plurality of possible adjustment values consists of {−1, 0}. In other examples, the plurality of possible adjustment values consists of {−1, 0, 1}. In some examples, the respective probability value for each possible adjustment value in the plurality of possible adjustment values is an unnormalized log-probability for the possible adjustment value.

Inputs to the neural network include the scaled transform coefficients and the scalar quantized coefficients. In some examples, neural network 211 is a fully convolutional neural network, e.g., as described elsewhere in this disclosure. In other examples, neural network 211 is an autoregressive network, e.g., as described elsewhere in this disclosure.

As discussed elsewhere in this disclosure, a computing system (which may include video encoder 200) may train neural network 211. As part of training neural network 211, the computing system may gather training labels using a heuristic search. The computing system may use the training labels as training targets in a training process for the neural network. In some examples, neural network 211 is trained to imitate a rate-distortion optimization algorithm that performs a brute force search over all possible quantization levels of the transform coefficients of the block.

In the example of FIG. 10, quantization unit 208 determines, based on the set of probabilities for a particular transform coefficient of the block, a quantization level for the particular transform coefficient (1006). For example, quantization unit 208 may determine, based on the set of probabilities for the particular transform coefficient, a most-likely adjustment value for the particular transform coefficient in the plurality of possible adjustment values. Additionally, in this example, quantization unit 208 may determine an updated value for the particular transform coefficient by adding the most-likely adjustment value for the particular transform coefficient to an absolute value of the particular transform coefficient (e.g., as shown in item 562 of FIG. 5B). Quantization unit 208 may then determine the quantization level for the particular transform coefficient by multiplying the updated value for the particular transform coefficient by a sign value of the particular transform coefficient (e.g., as shown in item 566 of FIG. 5B).

In some examples, as part of determining the scalar quantized coefficients, quantization unit 208 may discard sign information of the scalar quantized coefficients and discard sign information of the scaled transform coefficients (e.g., as shown in item 556 of FIG. 5B). Furthermore, in such examples, as part of determining the quantization level for the particular transform coefficient, quantization unit 208 may determine, based on the set of probabilities for the particular transform coefficient, an adjustment value for the particular transform coefficient. For instance, quantization unit 208 may determine the adjustment value as the adjustment value with the greatest probability. In the context of FIG. 5B, the adjustment value may be one of adjustment values 554. After discarding the sign information of the scaled transform coefficients, quantization unit 208 may determine an updated quantization level of the particular transform coefficient (e.g., one of updated quantization levels 560 of FIG. 5B) by adding a scalar quantized coefficient corresponding to the particular transform coefficient to the adjustment value for the particular transform coefficient (e.g., as shown in item 562 of FIG. 5B). Quantization unit 208 may then multiply the updated quantization level for the particular transform coefficient by a sign of the scalar quantized coefficient (e.g., carried sign 564 of FIG. 5B) corresponding to the particular transform coefficient to determine the quantization level for the particular transform coefficient (e.g., as shown in item 566 of FIG. 5B).

Video encoder 200 may signal, in a bitstream that includes an encoded representation of the video data, the determined quantization level for the particular transform coefficient (1008). Video encoder 200 may repeat steps 1006 and 1008 for each transform coefficient of the block.

The following is a non-limiting set of examples that may be in accordance with one or more techniques of this disclosure.

Example 1. A method of encoding video data, the method comprising: determining scaled transform coefficients, wherein determining the scaled transform coefficients comprises scaling transform coefficients of a block of the video data according to a given quantization step; determining scalar quantized coefficients, wherein determining the scalar quantized coefficients comprises applying scalar quantization to the scaled transform coefficients of the block; applying a neural network that determines a respective set of probabilities for each respective transform coefficient of the block, wherein: the respective set of probabilities for the respective transform coefficient includes a respective probability value for each possible adjustment value in a plurality of possible adjustment values, and inputs to the neural network include the scaled transform coefficients and the scalar quantized coefficients; determining, based on the set of probabilities for a particular transform coefficient of the block, a level for the particular transform coefficient; and signaling, in a bitstream that includes an encoded representation of the video data, the determined level for the particular transform coefficient.

Example 2. The method of example 1, wherein the neural network is a fully convolutional neural network.

Example 3. The method of example 1, wherein the neural network is an autoregressive network.

Example 4. The method of any of examples 2-3, further comprising: gathering training labels using a heuristic search; and using the training labels as training targets in a training process for the neural network.

Example 5. The method of any of examples 1-4, wherein the plurality of possible adjustment values consists of {−1, 0}.

Example 6. The method of any of examples 1-5, wherein the neural network is trained to imitate a rate-distortion optimization algorithm that performs a brute force search over all possible quantization levels of the transform coefficients of the block.

Example 7. The method of any of examples 1-6, wherein determining the level for the particular transform coefficient comprises: determining, based on the set of probabilities for the particular transform coefficient, a most-likely adjustment value for the particular transform coefficient in the plurality of possible adjustment values; determining an updated value for the particular transform coefficient by adding the most-likely adjustment value for the particular transform coefficient to an absolute value of the particular transform coefficient; and determining the level for the particular transform coefficient by multiplying the updated value for the particular transform coefficient by a sign value of the particular transform coefficient.

Example 8. The method of any of examples 1-7, wherein the respective probability value for each possible adjustment value in the plurality of possible adjustment values is an unnormalized log-probability for the possible adjustment value.

Example 9. The method of any of examples 1-8, wherein determining the scalar quantized coefficients comprises, for each scaled transform coefficient of the scaled transform coefficients: determining a scalar quantized coefficient corresponding to the scaled transform coefficient as being equal to an output of a floor function of a first value, wherein: the first value is equal to a second value plus a quantization offset parameter, and the second value is equal to the scaled transform coefficient divided by a step size.

Example 10. The method of any of examples 1-8, wherein determining the scalar quantized coefficients comprises, for each scaled transform coefficient of the scaled transform coefficients: determining a scalar quantized coefficient corresponding to the scaled transform coefficient as being equal to an output of a floor function of a first value, wherein the first value is equal to the scaled transform coefficient divided by a step size.

Example 11. The method of any of examples 1-10, wherein: determining the scalar quantized coefficients comprises discarding sign information of the scalar quantized coefficients, the method further comprises discarding sign information of the scaled transform coefficients, and determining the level for the particular transform coefficient comprises: determining, based on the set of probabilities for the particular transform coefficient, an adjustment value for the particular transform coefficient; after discarding the sign information of the scaled transform coefficients, determining an updated level of the particular transform coefficient by adding a scalar quantized coefficient corresponding to the particular transform coefficient to the adjustment value for the particular transform coefficient; and multiplying the updated level for the particular transform coefficient by a sign of the scalar quantized coefficient corresponding to the particular transform coefficient to determine the level for the particular transform coefficient.

Example 12. A device for coding video data, the device comprising one or more means for performing the method of any of examples 1-11.

Example 13. The device of example 12, wherein the one or more means comprise one or more processors implemented in circuitry.

Example 14. The device of any of examples 12 and 13, further comprising a memory to store the video data.

Example 15. The device of any of examples 12-14, further comprising a display configured to display decoded video data.

Example 16. The device of any of examples 12-15, wherein the device comprises one or more of a camera, a computer, a mobile device, a broadcast receiver device, or a set-top box.

Example 17. The device of any of examples 12-16, wherein the device comprises a video decoder.

Example 18. The device of any of examples 12-17, wherein the device comprises a video encoder.

Example 19. A computer-readable storage medium having stored thereon instructions that, when executed, cause one or more processors to perform the method of any of examples 1-11.

It is to be recognized that depending on the example, certain acts or events of any of the techniques described herein can be performed in a different sequence, may be added, merged, or left out altogether (e.g., not all described acts or events are necessary for the practice of the techniques). Moreover, in certain examples, acts or events may be performed concurrently, e.g., through multi-threaded processing, interrupt processing, or multiple processors, rather than sequentially.

In one or more examples, the functions described may be implemented in hardware, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transitory media, but are instead directed to non-transitory, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors implemented in circuitry, such as one or more digital signal processors (DSPs), general purpose microprocessors, application specific integrated circuits (ASICs), field programmable gate arrays (FPGAs), or other equivalent integrated or discrete logic circuitry. Accordingly, the terms "processor" and "processing circuitry," as used herein may refer to any of the foregoing structures or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples have been described. These and other examples are within the scope of the following claims.

What is claimed is:

1. A method of encoding video data, the method comprising:
   determining scaled transform coefficients, wherein determining the scaled transform coefficients comprises scaling transform coefficients of a block of the video data according to a given quantization step;

determining scalar quantized coefficients, wherein determining the scalar quantized coefficients comprises applying scalar quantization to the scaled transform coefficients of the block;

applying a neural network that determines a respective set of probabilities for each respective transform coefficient of the block, wherein:

the respective set of probabilities for the respective transform coefficient includes a respective probability value for each possible adjustment value in a plurality of possible adjustment values, and inputs to the neural network include the scaled transform coefficients and the scalar quantized coefficients;

determining a quantization level for a particular transform coefficient, wherein determining the quantization level for the particular transform coefficient comprises:

determining, based on the set of probabilities for the particular transform coefficient, an adjustment value for the particular transform coefficient in the plurality of possible adjustment values; and determining the quantization level for the particular transform coefficient based on the adjustment value for the particular transform coefficient; and signaling, in a bitstream that includes an encoded representation of the video data, the determined quantization level for the particular transform coefficient.

2. The method of claim 1, wherein the neural network is a fully convolutional neural network.

3. The method of claim 1, wherein the neural network is an autoregressive network.

4. The method of claim 1, further comprising:
gathering training labels using a heuristic search; and
using the training labels as training targets in a training process for the neural network.

5. The method of claim 1, wherein the plurality of possible adjustment values consists of $\{-1, 0\}$.

6. The method of claim 1, wherein the neural network is trained to imitate a rate-distortion optimization algorithm that performs a brute force search over all possible quantization levels of the transform coefficients of the block.

7. The method of claim 1, wherein:
determining the adjustment value for the particular transform coefficient comprises determining, based on the set of probabilities for the particular transform coefficient, a most-likely adjustment value for the particular transform coefficient in the plurality of possible adjustment values; and determining the quantization level for the particular transform coefficient comprises:

determining an updated value for the particular transform coefficient by adding the most-likely adjustment value for the particular transform coefficient to an absolute value of the particular transform coefficient; and determining the quantization level for the particular transform coefficient by multiplying the updated value for the particular transform coefficient by a sign value of the particular transform coefficient.

8. The method of claim 1, wherein the respective probability value for each possible adjustment value in the plurality of possible adjustment values is an unnormalized log-probability for the possible adjustment value.

9. The method of claim 1, wherein determining the scalar quantized coefficients comprises, for each scaled transform coefficient of the scaled transform coefficients:

determining a scalar quantized coefficient corresponding to the scaled transform coefficient as being equal to an output of a floor function of a first value, wherein:

the first value is equal to a second value plus a quantization offset parameter, and the second value is equal to the scaled transform coefficient divided by a step size.

10. The method of claim 1, wherein determining the scalar quantized coefficients comprises, for each scaled transform coefficient of the scaled transform coefficients:

determining a scalar quantized coefficient corresponding to the scaled transform coefficient as being equal to an output of a floor function of a first value, wherein the first value is equal to the scaled transform coefficient divided by a step size.

11. The method of claim 1, wherein:
determining the scalar quantized coefficients comprises discarding sign information of the scalar quantized coefficients, the method further comprises discarding sign information of the scaled transform coefficients, and determining the quantization level for the particular transform coefficient based on the adjustment value for the particular transform coefficient comprises:

after discarding the sign information of the scaled transform coefficients, determining an updated quantization level of the particular transform coefficient by adding a scalar quantized coefficient corresponding to the particular transform coefficient to the adjustment value for the particular transform coefficient; and multiplying the updated quantization level for the particular transform coefficient by a sign of the scalar quantized coefficient corresponding to the particular transform coefficient to determine the quantization level for the particular transform coefficient.

12. The method of claim 1, further comprising training the neural network, wherein training the neural network comprises:

determining a cross-entropy loss of output of the neural network;

scaling the cross-entropy loss of the neural network based on a rate-distortion sensitivity map; and training the neural network based on the scaled cross-entropy loss.

13. A device for encoding video data, the device comprising:

a memory to store the video data; and one or more processors implemented in circuitry, the one or more processors configured to:

determine scaled transform coefficients, wherein determining the scaled transform coefficients comprises scaling transform coefficients of a block of the video data according to a given quantization step;

determine scalar quantized coefficients, wherein determining the scalar quantized coefficients comprises applying scalar quantization to the scaled transform coefficients of the block;

apply a neural network that determines a respective set of probabilities for each respective transform coefficient of the block, wherein:

the respective set of probabilities for the respective transform coefficient includes a respective probability value for each possible adjustment value in a plurality of possible adjustment values, and inputs to the neural network include the scaled transform coefficients and the scalar quantized coefficients;

determine a quantization level for a particular transform coefficient, wherein the one or more processors are configured to, as part of determining the quantization level for the particular transform coefficient:
determine, based on the set of probabilities for the particular transform coefficient, an adjustment value for the particular transform coefficient in the plurality of possible adjustment values; and
determine the quantization level for the particular transform coefficient based on the adjustment value for the particular transform coefficient; and signal, in a bitstream that includes an encoded representation of the video data, the determined quantization level for the particular transform coefficient.

14. The device of claim 13, wherein the neural network is a fully convolutional neural network.

15. The device of claim 13, wherein the neural network is an autoregressive network.

16. The device of claim 13, wherein the one or more processors are further configured to:
gather training labels using a heuristic search; and
use the training labels as training targets in a training process for the neural network.

17. The device of claim 13, wherein the plurality of possible adjustment values consists of $\{-1, 0\}$.

18. The device of claim 13, wherein the neural network is trained to imitate a rate-distortion optimization algorithm that performs a brute force search over all possible quantization levels of the transform coefficients of the block.

19. The device of claim 13, wherein:
the one or more processors are configured to, as part of determining the adjustment value for the particular transform coefficient, determine, based on the set of probabilities for the particular transform coefficient, a most-likely adjustment value for the particular transform coefficient in the plurality of possible adjustment values;
the one or more processors are configured to, as part of determining the quantization level for the particular transform coefficient:
determine an updated value for the particular transform coefficient by adding the most-likely adjustment value for the particular transform coefficient to an absolute value of the particular transform coefficient; and
determine the quantization level for the particular transform coefficient by multiplying the updated value for the particular transform coefficient by a sign value of the particular transform coefficient.

20. The device of claim 13, wherein the respective probability value for each possible adjustment value in the plurality of possible adjustment values is an unnormalized log-probability for the possible adjustment value.

21. The device of claim 13, wherein the one or more processors are configured such that, as part of determining the scalar quantized coefficients, the one or more processors, for each scaled transform coefficient of the scaled transform coefficients:
determine a scalar quantized coefficient corresponding to the scaled transform coefficient as being equal to an output of a floor function of a first value, wherein:
the first value is equal to a second value plus a quantization offset parameter, and
the second value is equal to the scaled transform coefficient divided by a step size.

22. The device of claim 13, wherein the one or more processors are configured such that, as part of determining the scalar quantized coefficients, the one or more processors, for each scaled transform coefficient of the scaled transform coefficients:
determine a scalar quantized coefficient corresponding to the scaled transform coefficient as being equal to an output of a floor function of a first value, wherein the first value is equal to the scaled transform coefficient divided by a step size.

23. The device of claim 13, wherein:
the one or more processors are configured such that, as part of determining the scalar quantized coefficients, the one or more processors discard sign information of the scalar quantized coefficients,
the one or more processors are further configured to discard sign information of the scaled transform coefficients, and
the one or more processors are configured such that, as part of determining the quantization level for the particular transform coefficient based on the adjustment value for the particular transform coefficient, the one or more processors:
after discarding the sign information of the scaled transform coefficients, determine an updated quantization level of the particular transform coefficient by adding a scalar quantized coefficient corresponding to the particular transform coefficient to the adjustment value for the particular transform coefficient; and
multiply the updated quantization level for the particular transform coefficient by a sign of the scalar quantized coefficient corresponding to the particular transform coefficient to determine the quantization level for the particular transform coefficient.

24. The device of claim 13, wherein the device comprises one or more of a camera, a computer, a mobile device, a broadcast receiver device, or a set-top box.

25. The device of claim 13, wherein the one or more processors are configured to:
determine a cross-entropy loss of output of the neural network;
scale the cross-entropy loss of the neural network based on a rate-distortion sensitivity map; and
train the neural network based on the scaled cross-entropy loss.

26. A device for encoding video data, the device comprising:
means for determining scaled transform coefficients, wherein determining the scaled transform coefficients comprises scaling transform coefficients of a block of the video data according to a given quantization step;
means for determining scalar quantized coefficients, wherein determining the scalar quantized coefficients comprises applying scalar quantization to the scaled transform coefficients of the block;
means for applying a neural network that determines a respective set of probabilities for each respective transform coefficient of the block, wherein:
the respective set of probabilities for the respective transform coefficient includes a respective probability value for each possible adjustment value in a plurality of possible adjustment values, and inputs to the neural network include the scaled transform coefficients and the scalar quantized coefficients;

means for determining a quantization level for a particular transform coefficient, wherein the means for determining the quantization level for the particular transform coefficient comprises:

means for determining, based on the set of probabilities for the particular transform coefficient, an adjustment value for the particular transform coefficient in the plurality of possible adjustment values; and means for determining the quantization level for the particular transform coefficient based on the adjustment value for the particular transform coefficient; and means for signaling, in a bitstream that includes an encoded representation of the video data, the determined quantization level for the particular transform coefficient.

27. A non-transitory computer-readable storage medium having stored thereon instructions that, when executed, cause one or more processors to:

determine scaled transform coefficients, wherein determining the scaled transform coefficients comprises scaling transform coefficients of a block of video data according to a given quantization step;

determine scalar quantized coefficients, wherein determining the scalar quantized coefficients comprises applying scalar quantization to the scaled transform coefficients of the block;

apply a neural network that determines a respective set of probabilities for each respective transform coefficient of the block, wherein:

the respective set of probabilities for the respective transform coefficient includes a respective probability value for each possible adjustment value in a plurality of possible adjustment values, and inputs to the neural network include the scaled transform coefficients and the scalar quantized coefficients;

determine a quantization level for a particular transform coefficient, wherein as part of causing the one or more processors to determine the quantization level for the particular transform coefficient, the instructions cause the one or more processors to:

determine, based on the set of probabilities for the particular transform coefficient, an adjustment value for the particular transform coefficient in the plurality of possible adjustment values; and determine the quantization level for the particular transform coefficient based on the adjustment value for the particular transform coefficient; and signal, in a bitstream that includes an encoded representation of the video data, the determined quantization level for the particular transform coefficient.

* * * * *